US007222318B2

(12) United States Patent
Srinivasan

(10) Patent No.: US 7,222,318 B2
(45) Date of Patent: May 22, 2007

(54) CIRCUIT OPTIMIZATION FOR MINIMUM PATH TIMING VIOLATIONS

(75) Inventor: Adi Srinivasan, Fremont, CA (US)

(73) Assignee: Sequence Design, Inc., Santa Clara, CA (US)

( * ) Notice: Subject to any disclaimer, the term of this patent is extended or adjusted under 35 U.S.C. 154(b) by 596 days.

(21) Appl. No.: 10/627,933

(22) Filed: Jul. 25, 2003

(65) Prior Publication Data
US 2004/0088664 A1 May 6, 2004

Related U.S. Application Data

(62) Division of application No. 10/008,458, filed on Nov. 30, 2001, now Pat. No. 6,701,505.

(51) Int. Cl.
*G06F 17/05* (2006.01)
(52) U.S. Cl. .............................. 716/6; 716/7
(58) Field of Classification Search ............ None
See application file for complete search history.

(56) References Cited

U.S. PATENT DOCUMENTS

| | | | | |
|---|---|---|---|---|
| 5,402,356 A * | 3/1995 | Schaefer et al. | ............... | 716/1 |
| 5,507,029 A * | 4/1996 | Granato et al. | ................ | 716/6 |
| 5,764,528 A * | 6/1998 | Nakamura | ..................... | 716/6 |
| 5,896,301 A * | 4/1999 | Barrientos | ..................... | 716/8 |
| 6,434,731 B1 * | 8/2002 | Brennan et al. | .............. | 716/10 |
| 6,449,756 B1 * | 9/2002 | Malik et al. | .................... | 716/6 |
| 6,480,991 B1 * | 11/2002 | Cho et al. | ...................... | 716/8 |
| 6,487,697 B1 * | 11/2002 | Lu et al. | ........................ | 716/2 |
| 6,513,149 B1 * | 1/2003 | Donato | ........................ | 716/12 |
| 6,557,145 B2 * | 4/2003 | Boyle et al. | ................... | 716/2 |
| 6,591,407 B1 * | 7/2003 | Kaufman et al. | ............. | 716/10 |
| 6,792,582 B1 * | 9/2004 | Cohn et al. | .................... | 716/7 |
| 6,836,753 B1 * | 12/2004 | Silve | ............................. | 703/2 |
| 2003/0101399 A1 * | 5/2003 | Yoshikawa | .................. | 714/744 |

\* cited by examiner

*Primary Examiner*—Leigh M. Garbowski
(74) *Attorney, Agent, or Firm*—Edward C. Kwok; MacPherson Kwok Chen & Heid LLP

(57) ABSTRACT

A method is provided to optimize delay insertions for reducing timing violations. The method includes inserting a buffer between a driver and a receiver in a timing path and placing the buffer either inside or outside a bounding box that encloses the driver and the receiver. The placement of the buffer inside or outside the bounding box creates the appropriate effective loading on the buffer to generates the required minimum delay to avoid timing violations.

12 Claims, 13 Drawing Sheets

CIRCUIT OPTIMIZATION FOR MINIMUM PATH TIMING VIOLATIONS

This application is a divisional of prior application Ser. No. 10/008,458, filed Nov. 30, 2001, now U.S. Pat. No. 6,701,505 B1, issued Mar. 2, 2004.

FIELD OF THE INVENTION

The invention relates to integrated circuit design and more specifically to methods and systems for optimizing delay insertions for reducing timing violations in integrated circuit design.

BACKGROUND OF THE INVENTION

Designers use software tools to perform timing analysis on integrated circuit designs. The software tools can determine if a signal arrives too early or too late at the end of a timing path. The end of the timing path usually consists of either an I/O pin or an input pin of a sequential logic (e.g., a register or latch). When the end of the timing path consists of an input pin of a sequential logic, the early signal causes a setup time violation while the late signal causes a hold time violation. A setup time violation occurs when the signal fails to be present and unchanged at the input pin of the sequential logic for a specified time before the sequential logic is clocked. A hold time violation occurs when the signal fails to remain unchanged at the input terminal of the sequential logic for a specified time after the sequential logic element is clocked. Both setup and hold times must be satisfied for the sequential logic to propagate the appropriate output signal. When the end of the timing path is an I/O pin, the early and late signals fail to meet I/O timing constraints (e.g., board-level constraints between integrated circuit chips).

FIG. 6 shows that the signal to the end of the timing path must arrive within a timing window in each clock cycle (i.e., the signal to the input pin of the sequential logic or the I/O pin must transition within a window in each clock cycle) to avoid timing violations. This timing window is defined by a minimum required time (mRT) after the start of a clock cycle and a maximum required time (MRT) before the end of the same clock cycle. The minimum and the maximum required times are respectively determined from the hold and setup times of a sequential logic or I/O timing constraints imposed by external logic.

When the signal arrives too late at the end of the timing path, the timing violation is referred to as a "max path violation" because the maximum required time of the timing path has been violated. To fix the max path violation, the signal needs to be sped up to avoid a timing violation. Typically a conventional method fixes the max path violation by moving or resizing the logic elements in a timing path, deleting buffers, restructuring the logic, or re-synthesizing the integrated circuit design.

When the signal arrives too early at the end of the timing path, the timing violation is referred to as a "min path violation" because the minimum required time of the timing path has been violated. To fix the min path violation, the signal needs to be delayed to avoid a timing violation. Typically a conventional method fixes the min path violation by placing a buffer in between two elements in the timing path hereafter called "driver" and "receiver".

The conventional method places the buffer within a bounding box that encloses the driver and receiver. The conventional method attempts to select a buffer with an intrinsic delay (i.e., a delay generated by the buffer without an effective capacitive load at its output pin) equal to a required minimum delay D (FIG. 6) for the signal to arrive after the start of the timing window. When the intrinsic delays of the available buffers do not match the required minimum delay D, the conventional method selects the next largest buffer with an intrinsic delay greater than the required minimum delay D. The use of a larger buffer increases the cost of the integrated circuit because the larger buffer increases the size of the integrated circuit. Thus, what are needed are methods and systems that optimize delay insertions between drivers and receivers using available buffers to generate the required minimum delay D.

SUMMARY

A method is provided to optimize delay insertions for reducing a timing violation in a timing path. The method includes inserting a buffer in the timing path between a driver and a receiver and placing the buffer either inside or outside a bounding box that encloses the driver and the receiver. The placement of the buffer inside or outside the bounding box creates the appropriate effective loading on the buffer to generates a minimum delay required to avoid the timing violation.

DETAILED DESCRIPTION

In accordance with embodiments of the invention, a method 200 (FIG. 2) is provided for optimizing delay insertion in a timing path to avoid a min path violation. Method 200 inserts a buffer between a driver and a receiver in the timing path and places the buffer at a location that creates an effective capacitive loading on the buffer that generates a required minimum delay D (explained later with reference to FIG. 6) required to avoid the min path violation.

Figure 1:
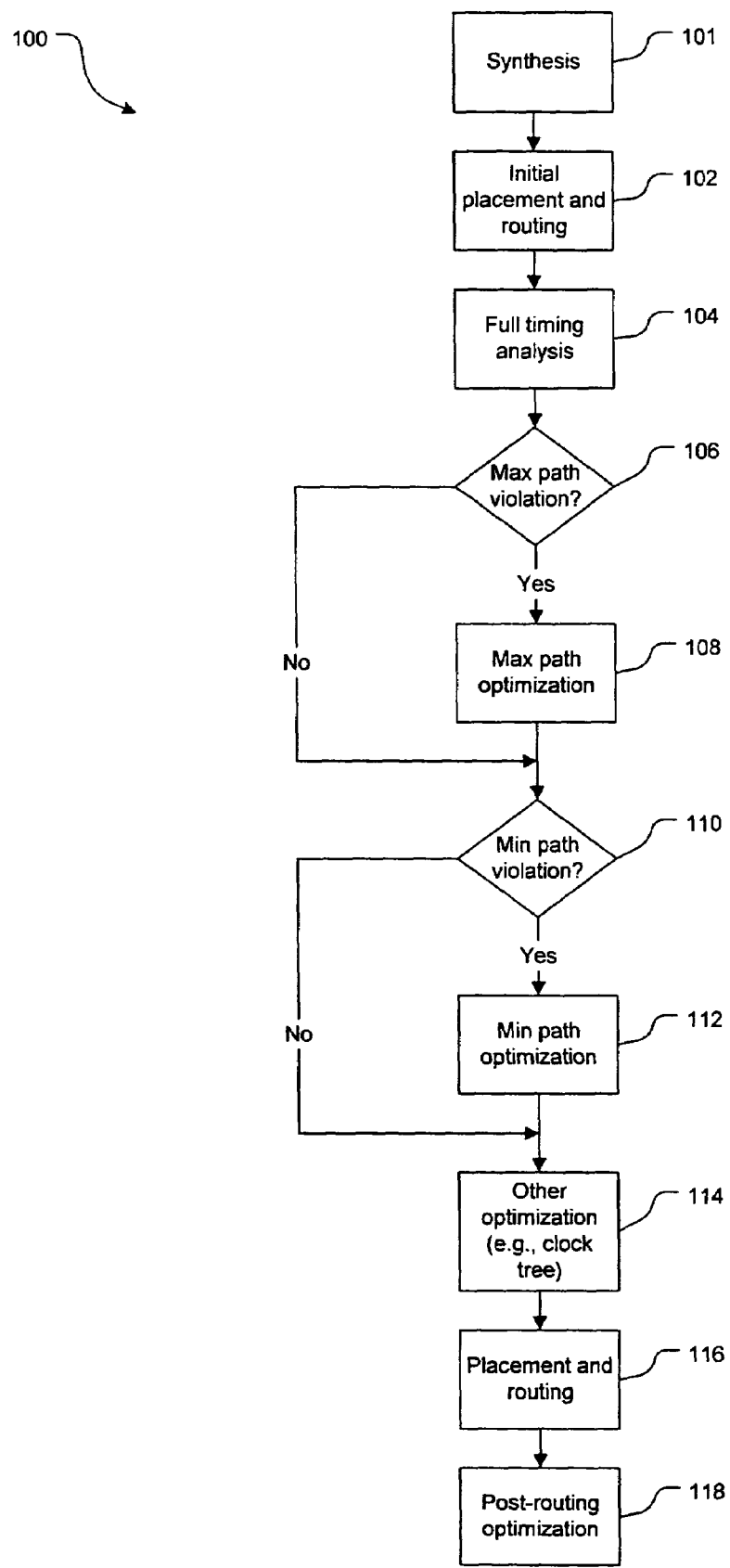
FIG. 1 shows a flowchart of a method for designing an integrated circuit in one embodiment of the invention.
Figure 5:
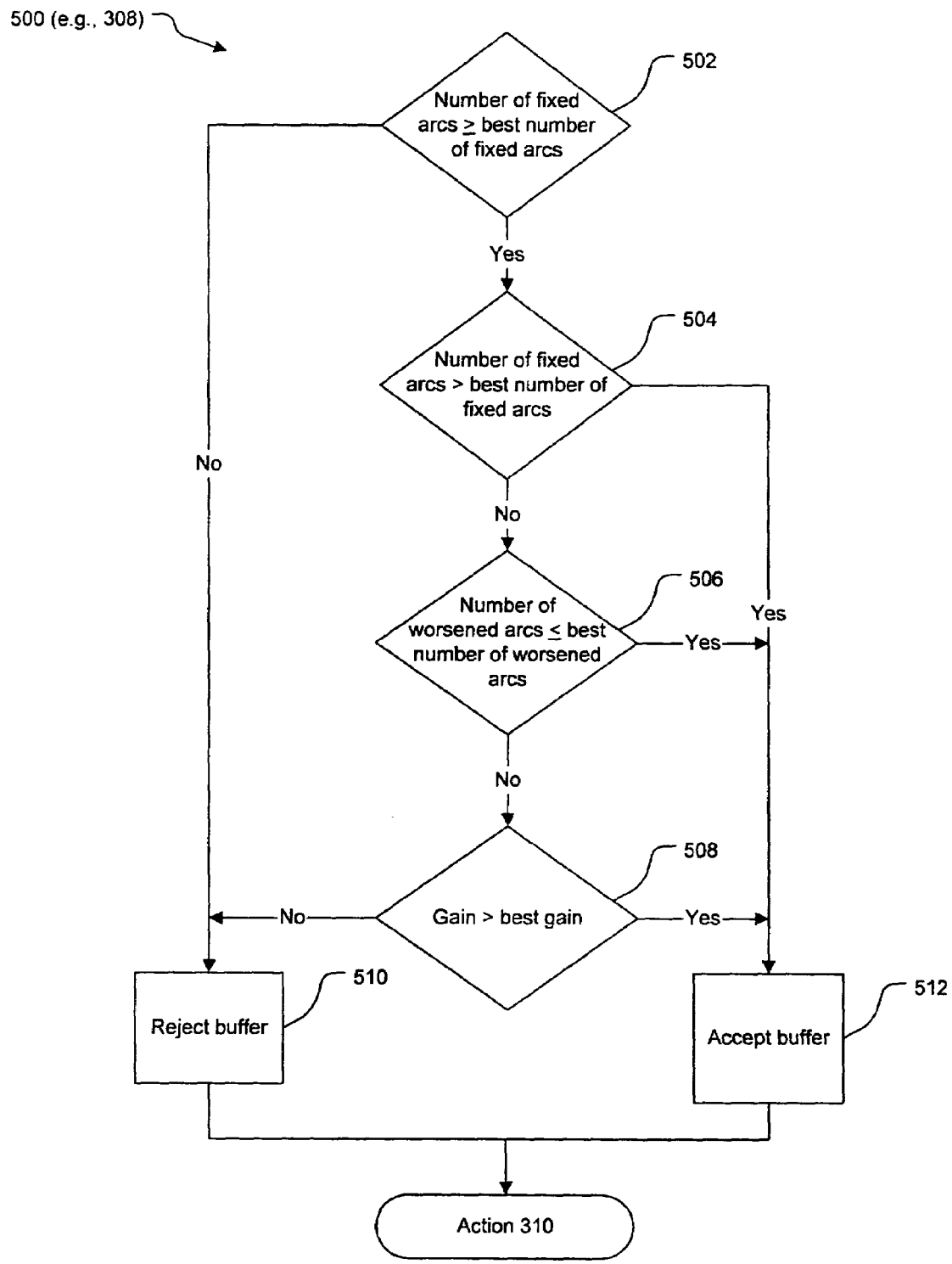
FIG. 5 shows a flowchart of a method for performing cost analysis of a node in the method of FIG. 3 in one embodiment.
Figure 9:
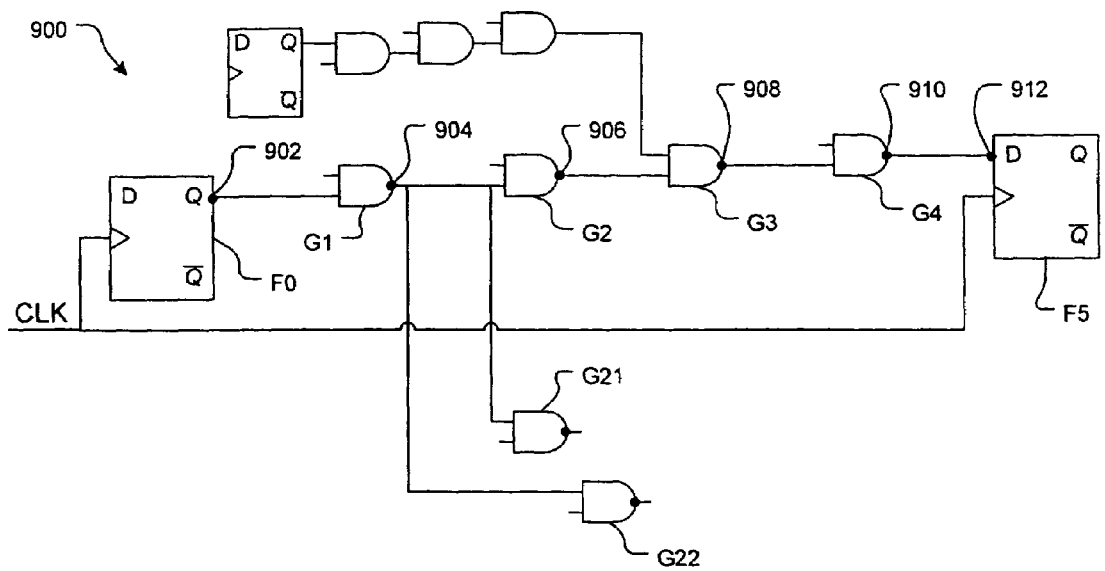
FIG. 9 shows an exemplary circuit design optimized using the method of FIGS. 2 to 5.

FIG. 1 illustrates a method 100 for designing an exemplary integrated circuit 900 (shown partially in FIG. 9). Method 100 includes method 200 (FIG. 2) to optimize delay insertions in integrated circuit 900. FIG. 5 illustrates a system 1500 including a computer 1528 that executes various software tools for implementing method 100.

In action 101 of method 100 (FIG. 1), a designer uses a "synthesis tool" to create a logic gate-level circuit description known as a "netlist". The synthesis tool is, e.g., software 1502 (FIG. 15) executed by computer 1528 to generate a netlist 1524. The synthesis tool selects the elements of the netlist from standard cells in a library 1520 (FIG. 15) in accordance with functional requirements 1521 and timing constraints 1522 provided by the designer. The synthesis tool is, e.g., Design Compiler from Synopsys of Mountain View, Calif.

Figure 14A:
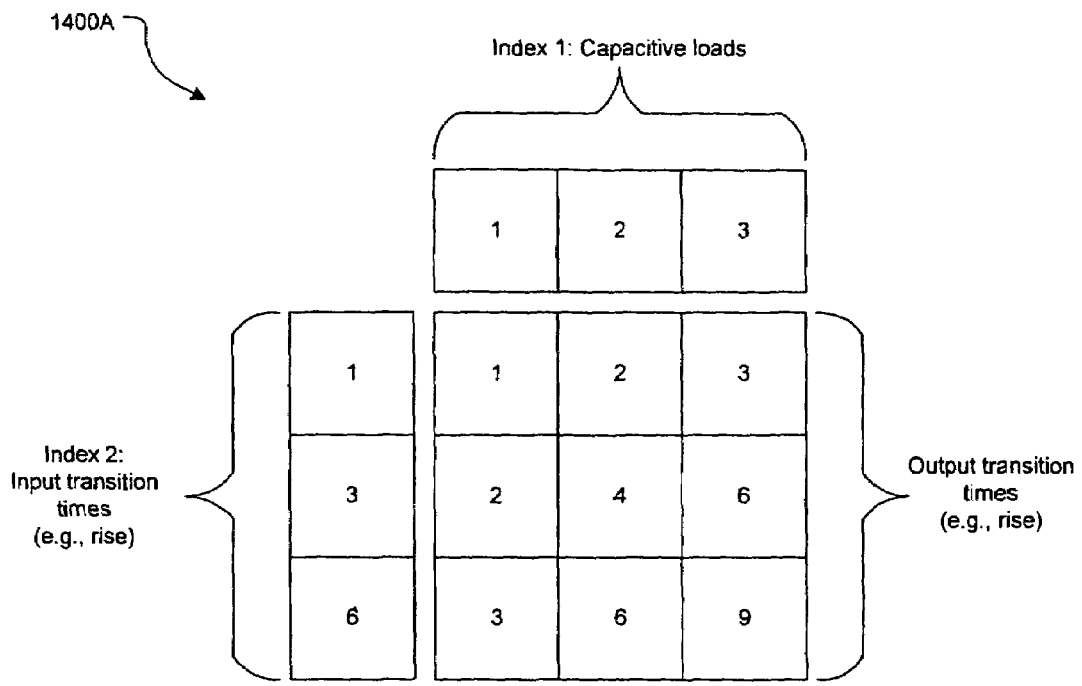
FIGS. 14A and 14B illustrate a 2-D nonlinear output transition time table and a 2-D nonlinear cell-delay table of a logic cell, respectively.
Figure 14B:
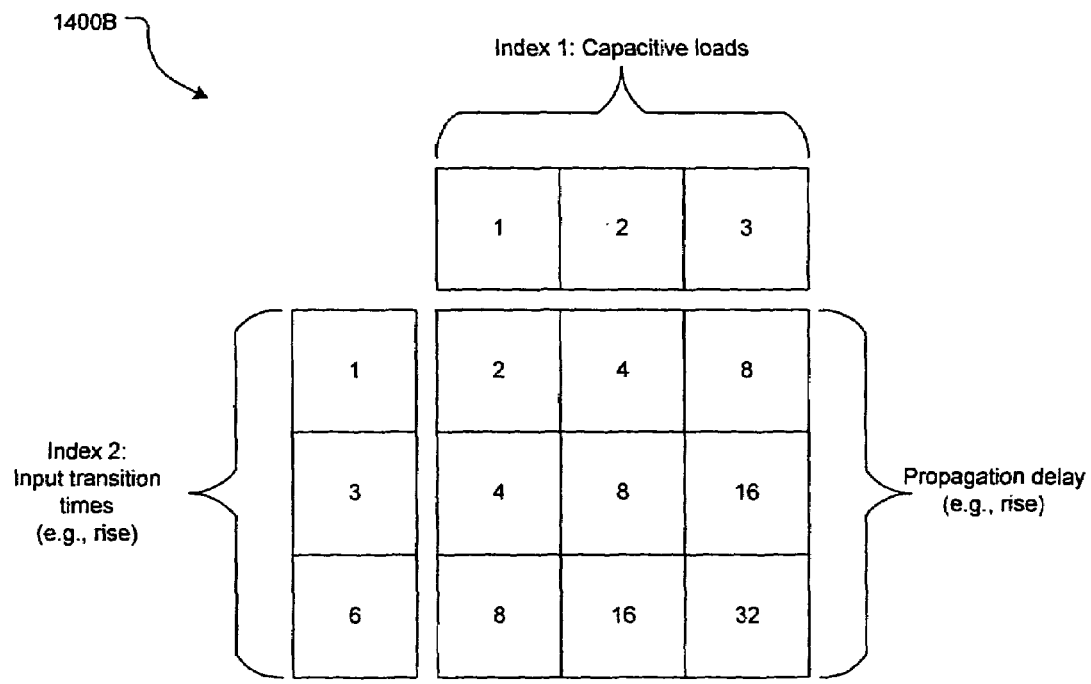

The standard cells in library 1520 are typically designed to the requirements of a target manufacturing technology. Each cell is characterized to provide a table of output transition times and a table of propagation delays. The outputs of these tables depend on effective capacitive loads (capacitive load viewed from output pin of a driver) and input transition times of the cell. These tables can specify whether the output transition times, input transition times, and propagation delays are for rising or falling signals. The two tables are hereafter referred to as "2-D nonlinear output transition time table" and "2-D nonlinear cell-delay table". FIGS. 14A and 14B graphically illustrate a 2-D nonlinear output transition time table 1400A and a 2-D nonlinear cell-delay table 1400B of a logic cell (e.g., logic cell G1 in FIG. 9), respectively. Tables 1400A and 1400B are used to respectively determine rising output transition times and rising propagation delays depending on the effective capacitive loads and the rising input transition times of the logic cell.

In action 102 (FIG. 1), the designer uses a "place and route" tool to initially place the standard cells of the netlist onto a "silicon real estate" and to initially route wires to provide interconnections among these standard cells. The place and route tool is, e.g., software 1504 (FIG. 15) executed by computer 1528 to generate a placement file 1526 of netlist 1524. A placement library 1516 (FIG. 15) defines the layout rules for a specific process (e.g., the number of placements sites, the number of placement rows, and the orientation of the cells to be placed in the sites). The placement and routing of these standard cells are typically guided by cost functions that minimize wiring lengths and the area requirements of the resulting integrated circuit. The place and route tool is, e.g., Silicon Ensemble from Cadence Design Systems, Inc. of San Jose.

In action 104 (FIG. 1), the designer uses a static timing analyzer to perform a full timing analysis of the entire integrated circuit 900 with the wires that were routed in action 102. The static timing analyzer is, e.g., software 1506 (FIG. 15) executed by computer 1528. The static timing analyzer is, e.g., ShowTime from Sequence Design, Inc. of San Jose.

The static timing analyzer uses a technology library 1518 (FIG. 15) and the previously described 2-D nonlinear output transition time and cell-delay tables in cell library 1520 to perform the full timing analysis. Technology library 1518 provides the correlation of wire capacitance as a function of wire length for wires that interconnect standard cells. If the length of a wire is known, then the effective capacitive load of the wire on a standard cell can be calculated as a function of the length of the wire from the correlation in the library, and vice versa. The capacitance of the wire, and vice versa can be added to the pin capacitance of a standard cell to determine the effective capacitive load of the wire and the standard cell on a driver. If the effective capacitive load and the input transition time of the standard cell are known, then the output transition time and the propagation delay of that standard cell can be determined from the 2-D nonlinear output transition time and cell-delay tables for the standard cell in cell library 1520.

The static timing analyzer provides the result of the timing analysis in terms of nodes along a timing path. Nodes are, e.g., the output pins of combinational logic, and input and output pins of sequential logic. For example in integrated circuit 900 (FIG. 9), the output pins of cells F0, G1, G2, G3, and G4 are respectively nodes 902, 904, 906, 908 and 910, and the input pin of cell F5 is node 912. A timing path is a signal path between a start node where a signal is launched in response to a clock signal, and an end node where the signal is latched in response to a clock signal. For example in integrated circuit 900 (FIG. 9), the timing path consists of a signal path between nodes 902 and 912. At node 902, sequential logic cell F0 launches a signal at a clock signal. At node 912, a sequential logic cell F5 latches a signal at a clock signal. Sequential logic cells F0 and F5 are, e.g., registers or latches.

The nodes in a timing path are divided into node levels. A node level indicates the maximum depth of a node from the start node where a signal is launched in response to a clock signal. For example in integrated circuit 900 (FIG. 9), node 904 is a level 1 node because it is the first node from node 902 (i.e., the start of the timing path), node 906 is a level 2 node because it is the second node from node 902, and so forth. If a node receives multiple input signals, then the node is part of multiple timing paths and has a node level of the maximum depth in the timing paths. For example in integrated circuit 900 (FIG. 9), node 908 is the third node from node 902 and the fourth node from another start node in another timing path, then node 908 is a level 4 node. Of course, this means in the timing path between nodes 902 and 912 there is not a level 3 node.

Figure 6:
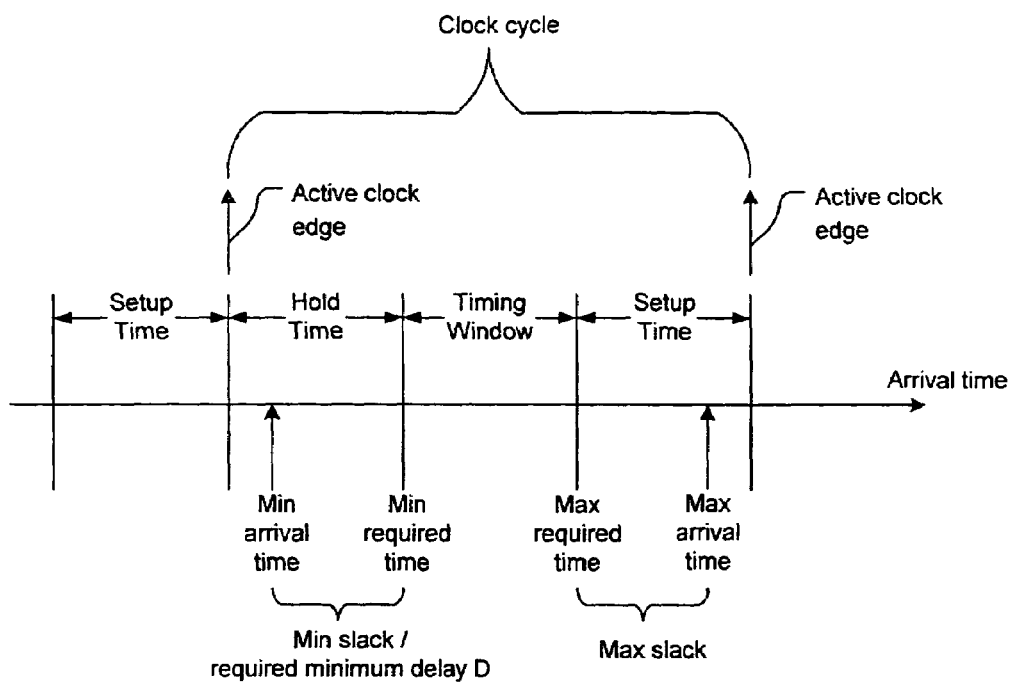
FIG. 6 shows a timing diagram with a timing window in which a signal from a driver to a receiver must arrive to avoid timing violations.

The static timing analyzer determines and saves in memory, for each node in integrated circuit 900, the input transition time ($tr_{in}$), the output transition time ($tr_{out}$), the minimum required time (mRT), the maximum required time (MRT), the minimum actual time (mAT), the maximum actual time (MAT), the worst minimum path slack (mS), and the worst maximum path slack (MS) from a rising edge and a falling edge of a signal. For clarity, the disclosure will use $tr_{in}$, $tr_{out}$, mRT, MRT, mAT, MAT, mS, and MS to indicate the timing values from a rising edge although the disclosure applies equally well to both a rising edge and a falling edge. FIG. 6 shows an exemplary timing diagram identifying the above timing values. The minimum actual time is the earliest time that a signal arrives at a node while the maximum actual time is the latest time that a signal arrives at the node. The worst minimum path slack is the difference of the minimum actual time from the minimum required time while the worst maximum path slack is the difference of the maximum required time from the maximum actual time. The formulas for mS and MS are given below.

$$mS = mAT - mRT \quad (1.1)$$

$$MS = MRT - MAT \quad (1.2)$$

A negative worst minimum path slack indicates a node with min path violation. In other words, the signal arrives at a node (i.e., an output pin of a receiver) from another node (i.e., an output pin of a driver) too early. Thus, for each node, there is at least one associated driver and one associated receiver. In an example that will be used throughout the disclosure, node 906 (FIG. 9) of integrated circuit 900 is assumed to have a negative worst minimum path slack. Thus, a signal from an output pin of associated driver logic G1 arrives too early at an output pin of associated receiver logic G2. The absolute value of a negative worst minimum path slack is also the amount of time by which a signal arrives early to a node and the amount of delay that must be inserted for the signal to arrive after the start of the timing window. In the continuing example, a required minimum delay D (FIG. 6) must be inserted in a path between driver logic G1 and receiver logic G2 to remove the min path violation at node 906.

Similarly, a negative worst maximum path slack indicates a max path violation. In other words, the signal arrives at the node too late. For example, if node 906 (FIG. 9) has a negative worst maximum path slack, then a signal from an output pin of driver logic G1 arrives too late to an output pin of driver logic G2. The absolute value of a negative worst maximum path slack is also the amount of time by which a signal arrives late to a node and the amount of delay that must be removed for the signal to arrive before the end of the timing window.

In action 106 (FIG. 1), the designer determines whether or not to correct max path violations. If so, action 106 is followed by action 108. If the designer does not with to correct max path violations, action 106 is followed by action 110.

In action 108 (FIG. 1), the designer uses a max path optimization tool to optimize nodes with max path violations. The max path optimization tool is, e.g., software 1508 (FIG. 15) executed by computer 1528. The max path optimization tool removes delays from the timing paths to meet the timing constraints imposed by the designer. The max path optimization tool is, e.g., PhysicalStudio from Sequence Design, Inc. Action 108 is followed by action 110.

In action 110 (FIG. 1), the designer determines whether or not to correct min path violations. If so, action 110 is followed by action 112. If the designer does not with to correct min path violations, action 110 is followed by action 114.

In action 112 (FIG. 1), the designer uses a min path optimization tool to optimize nodes with min path violations. The min path optimization tool is, e.g., software 1510 (FIG. 15) executed by computer 1528. The min path optimization tool inserts buffers at points in timing paths to meet the timing constraints imposed by the designer. These buffers are added to netlist 1524. One embodiment of a method 200 used by min path optimization tool 1510 is later described with reference to FIGS. 2–5. Action 112 is followed by action 114.

In action 114 (FIG. 1), the designer uses other tools to optimize the integrated circuit. These other tools are, e.g., software 1512 (FIG. 15) executed by computer 1528. Software 1512 may include a clock optimization tool to ensure that the clock signals to sequential logic elements arrive at substantially the same time. The clock optimization tool is, e.g., Physical Studio from Sequence Design, Inc.

In action 116 (FIG. 1), the designer uses the place and route tool to again place the standard cells and the added buffers of netlist 1524 and to route wires to provide interconnections among these standard cells and the added buffers. The place and route tool legalizes the placement of the cells and the routing of the conductors accordingly to the design constraints imposed by the designer.

In action 118 (FIG. 1), the designer uses a post-routing tool to optimize the integrated circuit. The post-routing tool is, e.g., software 1514 (FIG. 15) executed by computer 1528. The post-routing tool attempts to further meet the timing, area, power, capacitance, and transition time constraints imposed by the designer. The post-routing tool is, e.g., Physical Studio from Sequence Design, Inc.

Figure 2:
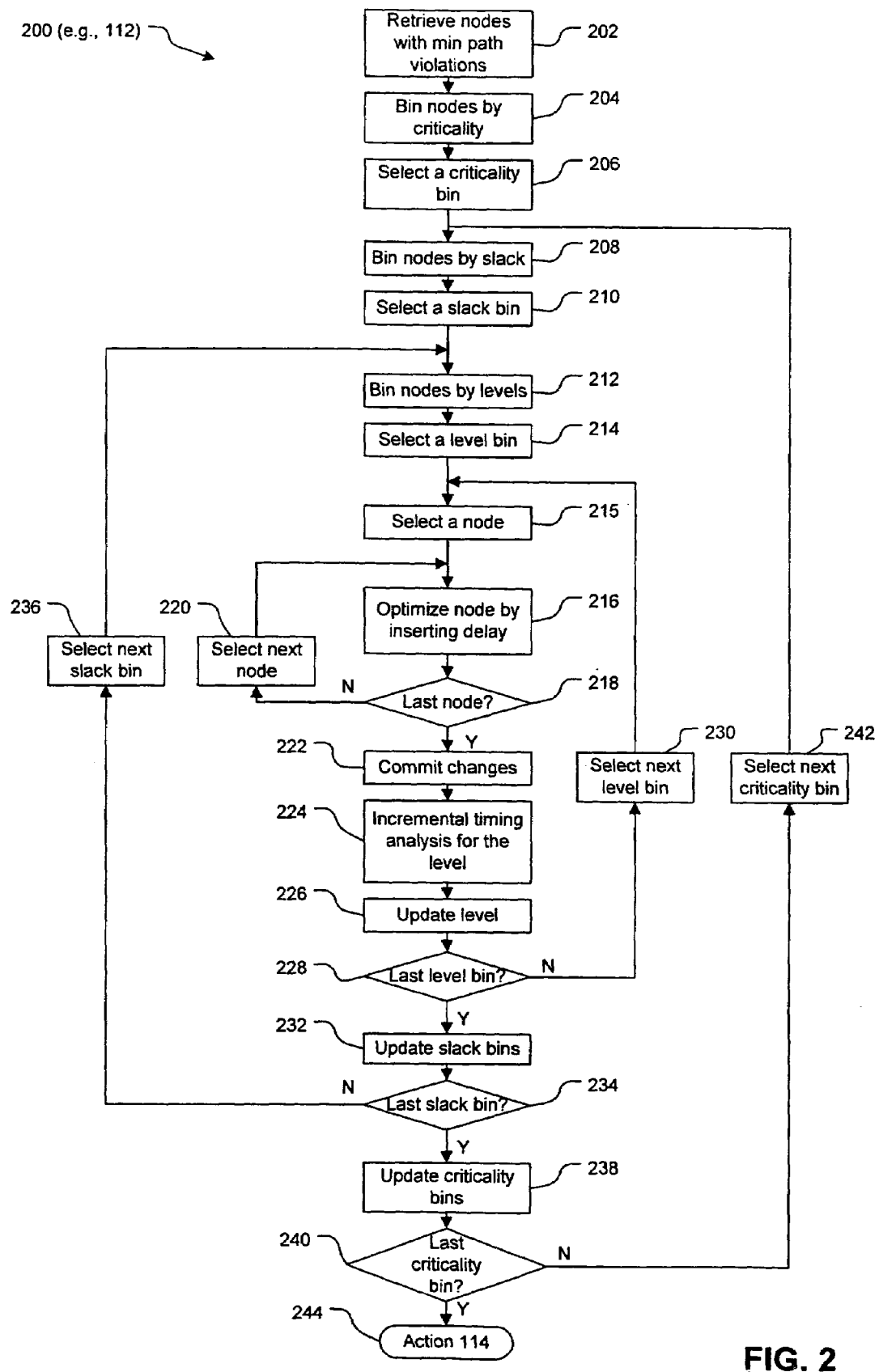
FIG. 2 shows a flowchart of a method for sorting nodes with min path violations in the method of FIG. 1 in one embodiment.

FIG. 2 shows one embodiment of method 200 for optimizing nodes with min path violations. In action 202, computer 1528 retrieves all nodes and their associated information (e.g., $tr_{in}$, $tr_{out}$, mRT, MRT, mAT, MAT, mS, and MS) from memory. These information were previously determined by the static timing analyzer in action 104 (FIG. 1). As previously discussed, the static timing analyzer saves the $tr_{in}$, $tr_{out}$, mRT, MRT, mAT, MAT, mS, and MS for each node. In the continuing example, computer 1528 retrieves, intera alia, nodes 902 to 912 (FIG. 9) and their associated information.

In action 204 (FIG. 2), computer 1528 places the retrieved nodes into a first level of bins in memory. In one embodiment of action 204, computer 1528 places the nodes into criticality bins 1, 2, 3, 4, 5, 6, 7, 8, and 9 (FIG. 7) according to the criticality of their worst minimum and maximum path slacks.

Worst minimum and maximum path slacks are divided into three criticality categories of critical, sub-critical, and non-critical. A worst minimum path slack is critical if it is less than a first minimum slack value. A worst minimum path slack is sub-critical if it is between the first minimum slack value and a second minimum slack value. A worst minimum path slack is non-critical if it is greater than the second minimum slack value. The first and the second minimum slack values can be specified the designer. By default, the first minimum slack value is 0 and the second minimum slack value is a fraction of a single-inverter-delay (e.g., approximately 100 picoseconds for a 0.35 micron process).

Similarly, a worst maximum path slack is critical if it is less than a first maximum slack value. A worst maximum path slack is sub-critical if it is between the first maximum slack value and a second maximum slack value. A worst maximum path slack is non-critical if it is greater than the second maximum slack value. The first and the second worst maximum slack values can be specified by the designer. By default, the first maximum slack value is 0 and the second maximum slack value is a fraction of a single-inverter-delay. Of course, computer 1528 can place the nodes into first level bins by different criteria in different embodiments.

Figure 7:
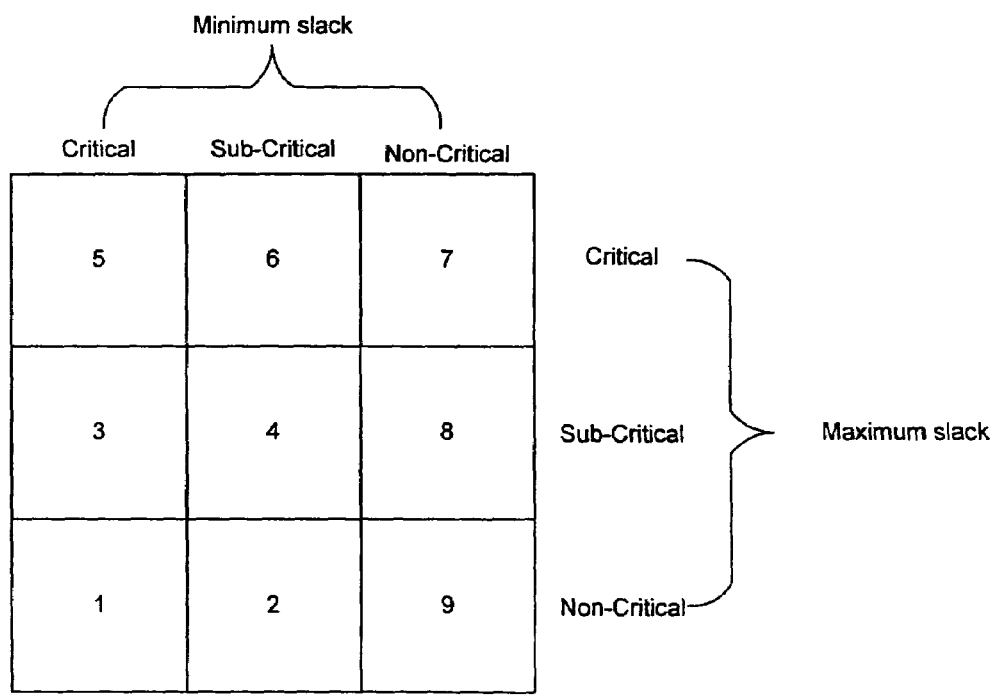
FIG. 7 shows criticality bins where nodes are sorted and placed in the method of FIG. 2.

FIG. 7 shows that computer 1528 places nodes with critical worst minimum path slack and non-critical worst maximum path slack into criticality bin 1, nodes with sub-critical worst minimum path slack and non-critical worst maximum path slack into criticality bin 2, nodes with critical worst minimum path slack and sub-critical worst maximum path slack into criticality bin 3, nodes with sub-critical worst minimum path slack and sub-critical worst maximum path slack into criticality bin 4, nodes with critical worst minimum path slack and critical worst maximum path slack into criticality bin 5, nodes with sub-critical worst minimum path slack and critical worst maximum path slack into criticality bin 6, nodes with non-critical worst minimum path slack and critical worst maximum path slack into criticality bin 7, nodes with non-critical worst minimum path slack and sub-critical worst maximum path slack into criticality bin 8, and nodes with non-critical worst minimum path slack and non-critical worst maximum path slack into criticality bin 9.

In the continuing example, node 906 is assumed to have a critical worst minimum path slack and a non-critical worst maximum path slack. Thus, computer 1528 places node 906 into criticality bin 1.

In action 206 (FIG. 2), computer 1528 selects a criticality bin from criticality bins 1 to 6. In one embodiment of action 206, computer 1528 selects a criticality bin in an order that can be specified by the designer. By default, computer 1528 selects a criticality bin in an ascending order from bin 1 to 6 by default. Bins 7 to 9 are not selected because they contain nodes with non-critical worst minimum path slacks that do not need optimization.

In action 208 (FIG. 2), computer 1528 places the nodes into a second level of bins. In one embodiment of action 208, computer 1528 places the nodes into a predetermined number of slack bins (e.g., slack bins 1-1A, 1-2A, 1-3A, and 1-4A of FIG. 8A) between a first minimum slack value and a second minimum slack value of the nodes. The number of the slack bins can be specified by the user. By default, computer 1528 creates four slack bins. The first minimum slack value is the most negative worst minimum slack of all the nodes in the selected criticality bin. The second minimum slack value is 0. In the continuing example, computer 1528 places node 906 into slack bin 1-1A because node 906 is assumed to have a worst minimum path slack near the least worst minimum path slack. Of course, computer 1528 can place the nodes into second level bins by different criteria in different embodiments.

In action 210 (FIG. 2), computer 1528 selects a slack bin. In one embodiment of action 210, computer 1528 always selects the slack bin having nodes with most negative worst minimum path slacks (i.e., slack bin 1-1A in FIG. 8A, slack bin 1-1B in FIG. 8B, slack bin 1-1C in FIG. 8C, and slack bin 1-1D in FIG. 8D).

In action 212 (FIG. 2), computer 1528 places the nodes into a third level of bins. In one embodiment of action 212, computer 1528 places the nodes into level bins by the node level of each node. As previously described, the node level indicates the maximum depth of a node in one or more timing paths. In the continuing example, node 906 is a level 2 node. Thus, computer 1528 places node 906 into a level 2 bin. Of course, computer 1528 can place the nodes into third level bins by different criteria in different embodiments.

In action 214 (FIG. 2), computer 1528 selects a level bin. In one embodiment of action 214, computer 1528 selects the level bin by ascending order (e.g., levels 1, 2, 3 . . . ). In the continuing example, computer 1528 is assumed to have selected level bin having level 2 nodes (including node 906).

In action 215 (FIG. 2), computer 1528 selects a node from the selected level bin. In one embodiment, computer 1528 randomly selects the node from the selected level bin. In the continuing example, computer 1528 is assumed to have selected node 906.

In action 216 (FIG. 2), computer 1528 optimizes the selected node. Computer optimizes the selected node by inserting a buffer at a specific location between associated driver and receiver of the selected node in a timing path. The specific location creates the appropriate effective loading on the buffer to generate the required minimum delay D.

In the continuing example, computer 1528 places a buffer 1106 (FIGS. 11 to 13) at some specific location between an output pin 1004 of driver cell G1 and an input pin 1006 of receiver cell G2. One embodiment of action 216 is later described with reference to a method 300 in FIGS. 3 and 4.

In action 218 (FIG. 2), computer 1528 determines if it has optimized the last node in the selected level bin. If so, action 218 is followed by action 222. If computer 1528 has not optimized the last node in the selected level bin, action 218 is followed by action 220.

In action 220 (FIG. 2), computer 1528 selects a next node and method 200 cycles until computer 1528 has optimized all the nodes in the selected level bin. In one embodiment of action 220, computer 1528 randomly selects the next node.

Figure 15:
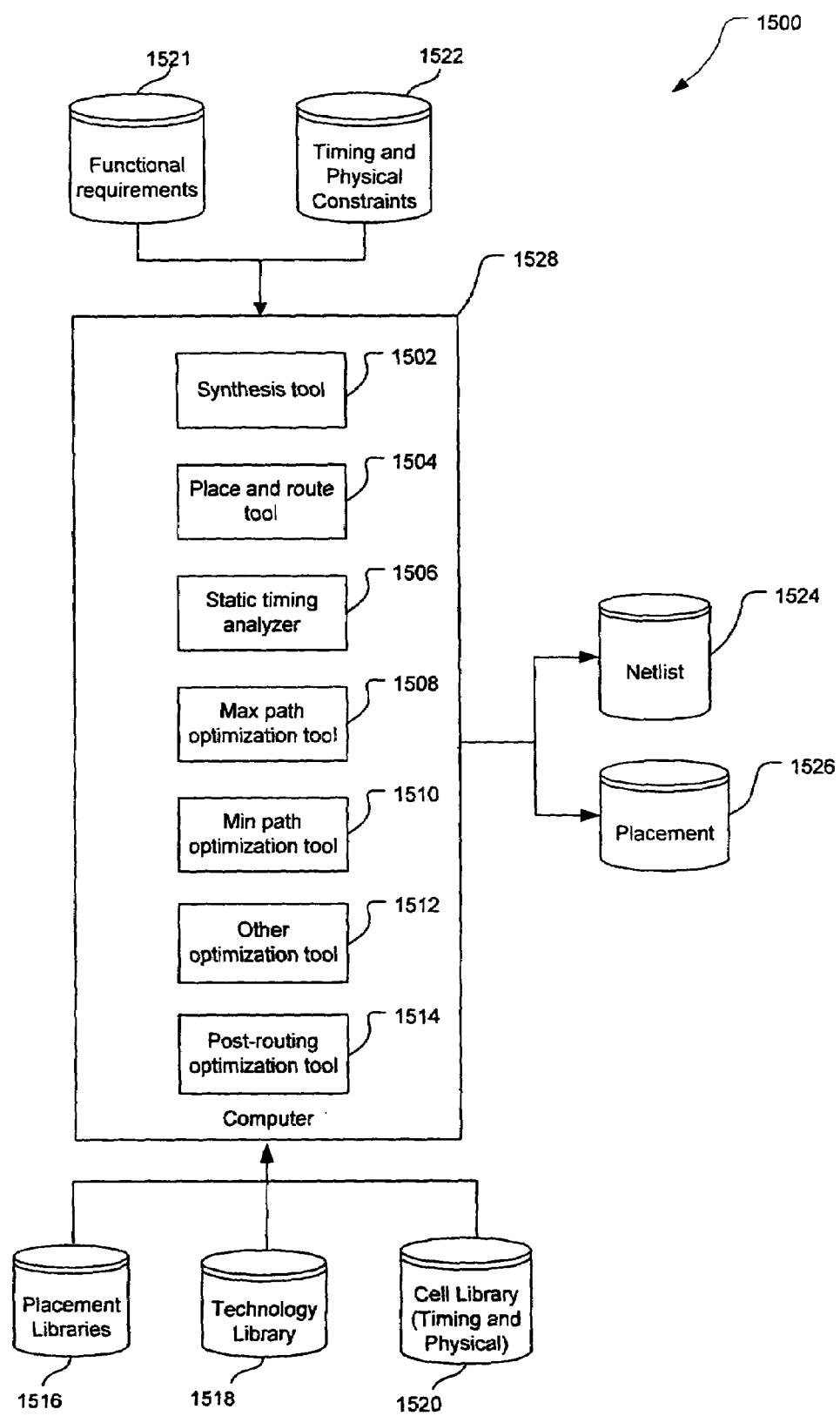
FIG. 15 shows a system including a computer that executes various software tools for implementing method of FIG. 1 in one embodiment.

In action 222 (FIG. 2), computer 1528 commits the changes made to integrated circuit 900 in action 216. Computer 1528 commits the changes by adding the inserted buffers to netlist 1524. In the continuing example, computer 1528 adds, inter alia, selected buffer 1106 between cells G1 and G2 to netlist 1524 (FIG. 15). Action 222 is followed by action 224.

In action 224 (FIG. 2), computer 1528 performs an incremental timing analysis. In incremental timing analysis, computer 1528 updates the timing changes due to the committed changes in action 222. From the incremental analysis, minimum arrival time, maximum arrival time, minimum required time, maximum required time, minimum path slacks, and maximum path slacks are re-determined for the nodes affected by the committed changes. In the continuing example, computer 1528 re-determines the timing values of, inter alia, node 906.

In action 226 (FIG. 2), computer 1528 updates the level bins. Computer 1528 updates the level bins because the insertion of buffers creates new nodes and changes the node levels of the preexisting nodes in the timing paths. In the continuing example, node 906 is assumed to have been optimized so a new node (from the output pin of driver G1 to the output pin of buffer 1106) is inserted between nodes 904 and 906. Thus, computer 1528 places the new node in level 2 bin, node 906 into level 3 bin, and so forth.

In action 228 (FIG. 2), computer 1528 determines if it has optimized the nodes in the last level bin. If so, action 228 is followed by action 232. If computer 1528 has not optimized the nodes in the last level bin, then action 228 is followed by action 230.

In action 230 (FIG. 2), computer 1528 selects a next level bin and method 200 cycles until computer 1528 has optimized all the nodes in all the level bins of the selected slack bin. As previously described with respect to action 214, computer 1528 selects a next level bin by ascending order (e.g., level 1, 2, 3 . . . ).

In action 232 (FIG. 2), computer 1528 updates the slack bins. In one embodiment of action 232, computer 1528 decrements the number of slack bins by one, and then places the nodes into the reduced number of slack bins according to their worst minimum path slacks recalculated in the incremental timing analysis of action 224.

Figure 8A:
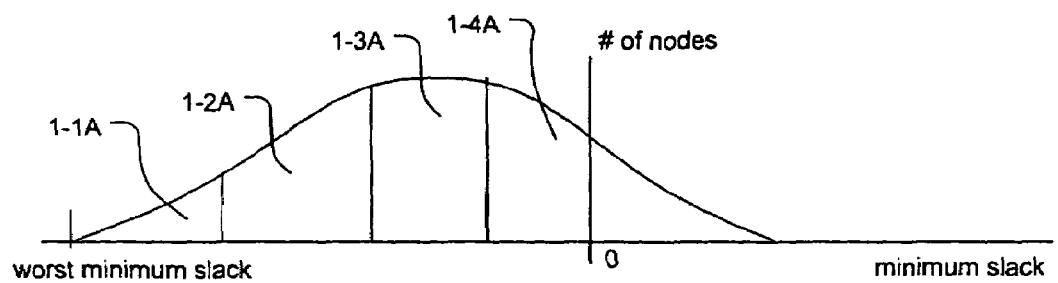
FIGS. 8A, 8B, 8C and 8D show slack bins where nodes are sorted and placed in the method of FIG. 2.
Figure 8B:
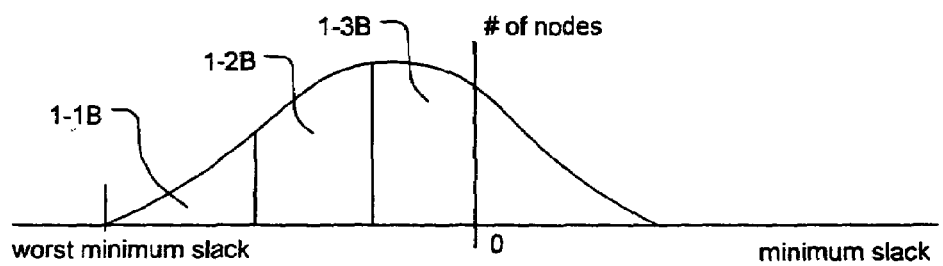

FIGS. 8A and 8B show that after the nodes in slack bin 1-1A are optimized, the population curve of the nodes shifts to the right because at least some of the nodes with negative worst minimum path slacks (i.e., with min path violations) in slack bin 1-1A have been optimized to have more positive minimum path slacks. Computer 1528 decrements the number of slack bins by one (e.g., from four to three), and then places the nodes into the reduced number of slack bins (e.g., slack bins 1-1B, 1-2B, and 1-3B in FIG. 8B).

Figure 8C:
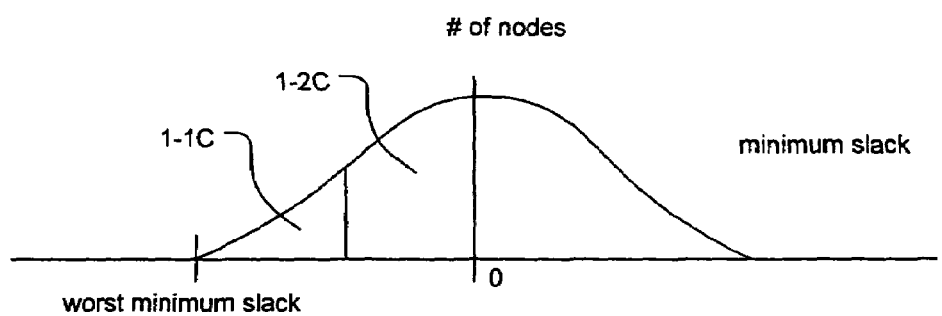

FIGS. 8B and 8C show that after the nodes in slack bin 1-1B are optimized in a next pass through action 232, the population curve of the nodes shifts even more to the right. Again, computer 1528 decrements the number of slack bins by one (e.g., from three to two), and then places the nodes into the reduced number of slack bins (e.g., slack bin 1-1C and 1-2C in FIG. 8C). Thus, computer 1528 eventually optimizes all the nodes in the selected criticality bin by decreasing the number of slack bins and optimizing the slack bin with nodes having most negative worst minimum path slacks. In the continuing example, computer 1528 does not put node 906 in any of the slack bins because node 906 is assumed to have been optimized to have a positive minimum path slack. Thus, node 906 contributes to the migration of the population curve to the right.

Figure 8D:
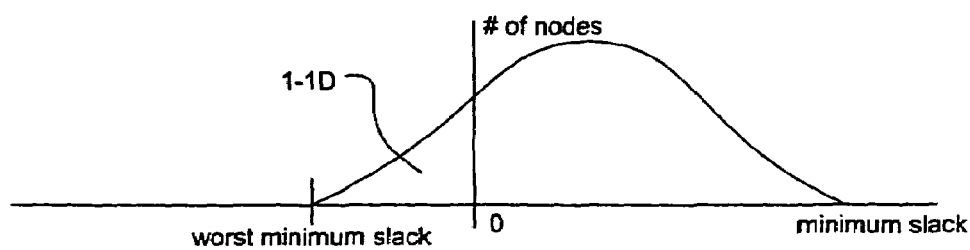

In action 234 (FIG. 2), computer 1528 determines if it has optimized the nodes in the last remaining slack bin (e.g., slack bin 1-1D of FIG. 8D). If so, action 234 is followed by action 238. If computer 1528 has not optimized the nodes in the last remaining slack bin, then action 234 is followed by action 236.

In action 236 (FIG. 2), computer 1528 selects the slack bin with most negative worst minimum path slacks (e.g., slack bin 1-1B in FIG. 8B, and slack bin 1-1C in FIG. 8C) and method 200 cycles until computer 1528 has optimized all the nodes in the selected criticality bin.

In action 238 (FIG. 2), computer 1528 updates the criticality bins. In one embodiment of action 238, computer 1528 again places the nodes into criticality bins 1, 2, 3, 4, 5, 6, 7, 8, and 9 (FIG. 7) according to the criticality of their worst minimum and maximum path slacks. As previously discussed, the worst minimum and maximum path slacks of the nodes in the selected criticality bin are recalculated in the incremental analysis of action 224 because they have been optimized in action 216. Thus the criticality bins are updated with the nodes according to their new worst minimum and maximum path slacks. Action 238 is followed by action 240.

In action 240 (FIG. 2), computer 1528 determines if it has reached a predetermined criticality bin. In one embodiment of action 240, computer 1528 determines if it has reached criticality bin 6 because the nodes in criticality bins 7 to 9 have non-critical worst minimum path slacks that do not need optimization. If so, action 240 is followed by action 244. If computer 1528 has not reached the predetermined criticality bin, then action 240 is followed by action 242.

In action 242 (FIG. 2), computer 1528 selects a next criticality bin and method 200 cycles until computer 1528 has optimized all the nodes in all the predetermined criticality bins. In one embodiment, computer 1528 selects a next criticality bin in an order that can be specified by the user. By default, computer 1528 selects a criticality bin in an ascending order from bin 1 to 6.

In action 244 (FIG. 2), computer 1528 ends method 200 and returns to action 114 (FIG. 1) of method 100 because computer 1528 has optimized all the nodes in all the predetermined criticality bins (e.g., criticality bins 1 to 6).

Figure 3:
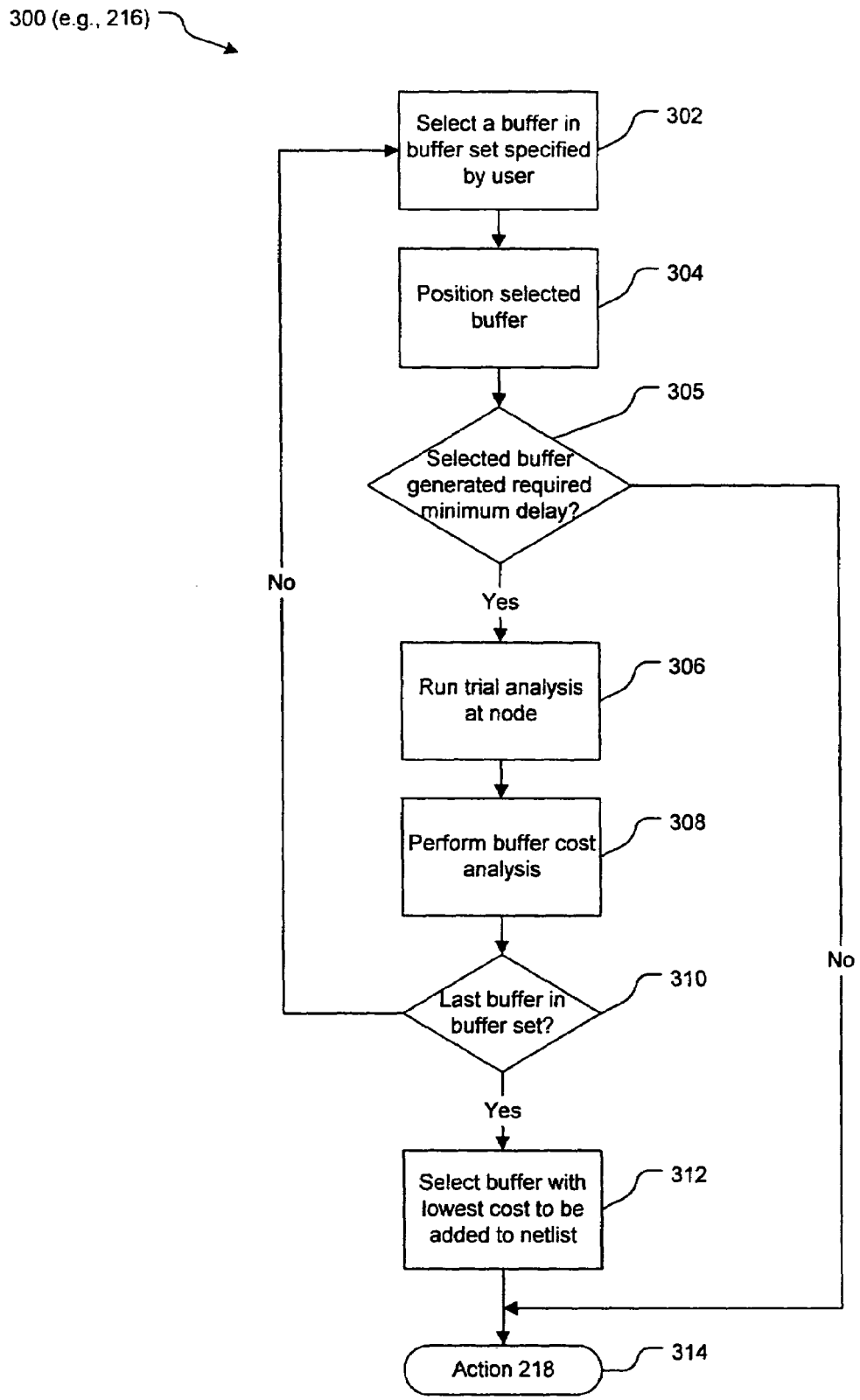
FIG. 3 shows a flowchart of a method for optimizing the nodes in the method of FIG. 2 in one embodiment.

FIG. 3 shows one embodiment of method 300 for optimizing a selected node in action 216 (FIG. 2). In action 302 (FIG. 3), computer 1528 selects a buffer in a buffer set from cell library 1520 (FIG. 15) specified by the designer. If the designer does not specify the buffer set, computer 1528 selects a buffer from all the buffers in cell library 1520 by default. In one embodiment of action 302, computer 1528 selects the buffer by the ascending order of the delays of the buffers at (1) the effective capacitive load (including wire capacitance and pin capacitance) of all the elements coupled to the driver and (2) at the input transition time to the receiver from the driver with the effective capacitive load of all the elements coupled on the driver. Computer 1528 also does not select buffers with intrinsic delays greater than the required minimum delay D. In the continuing example, computer 1528 is assumed to have selected buffer 1106 (FIGS. 10 to 13).

In action 304 (FIG. 3), computer 1528 positions the selected buffer at a location between the associated driver and receiver of the selected node to produce the required minimum delay D. One embodiment of action 304 is later described with reference to method 400 in FIG. 4. Of course, computer 1528 may position the buffer by different methods (new or preexisting) in different embodiments.

In action 305 (FIG. 3), computer 1528 determines if the selected buffer was able to produce the required minimum delay D in action 304. If so, action 305 is followed by action 306. If the selected buffer is unable to produced the required minimum delay D, action 305 is followed by action 314 and computer 1528 ends method 300 and returns to action 218 (FIG. 2) of method 200.

In action 306 (FIG. 3), computer 1528 performs a trial analysis at the selected node. A trial analysis is a timing analysis performed with the buffer inserted between the associated driver and receiver of the selected node without committing changes to the netlist. Trail analysis recalculates minimum arrival time, maximum arrival time, minimum required time, maximum required time, minimum path slack, and maximum path slack of nodes in a cone of change. The cone of change is an area downstream in the timing path from the selected node where the nodes have varying changes to their worst cumulative delay greater than a threshold value. The designer can specify the threshold value or computer 1528 sets the threshold value by default (e.g., 0). The trial analysis is, e.g., the "what-if" analysis in the static timing analyzer ShowTime from Sequence Design, Inc.

If the minimum path slack of any node affected by the insertion of the buffer has become positive, that node is categorized as a node with an improved timing arc (between the output pins of the associated driver and receiver). Conversely, if the minimum path slack of any node affected by the insertion of the buffer has become negative, that node is categorized as a node with a worsened timing arc. In the continuing example, nodes 906, 908, and 910 are assumed to have improved timing arcs.

In action 308 (FIG. 3), computer 1528 performs a cost analysis of the selected buffer to determine if the selected buffer offers a best combination of performance and usage of area. One embodiment of action 308 is later described with reference to a method 500 in FIG. 5. Of course, computer 1528 may perform the cost analysis by different methods (new or preexisting) in different embodiments. In the continuing example, computer 1528 is assumed to have selected buffer 1106 out of the buffer set because buffer 1106 offers the best cost when compared with the other buffers in the buffer set.

In action 310 (FIG. 3), computer 1528 determines if the selected buffer is the last buffer in the buffer set. If so, action 310 is followed by action 312 where computer 1528 selects the buffer that generates the required minimum delay D with the lowest cost to be added to the netlist. Action 312 is followed by action 314 where computer 1528 ends method 300 and returns to action 218 (FIG. 2) of method 200. If the selected buffer is not the last buffer in the buffer set, then action 310 is followed by action 302 and method 300 cycles until computer 1528 has compared all the buffers in the buffer set.

Figure 4:
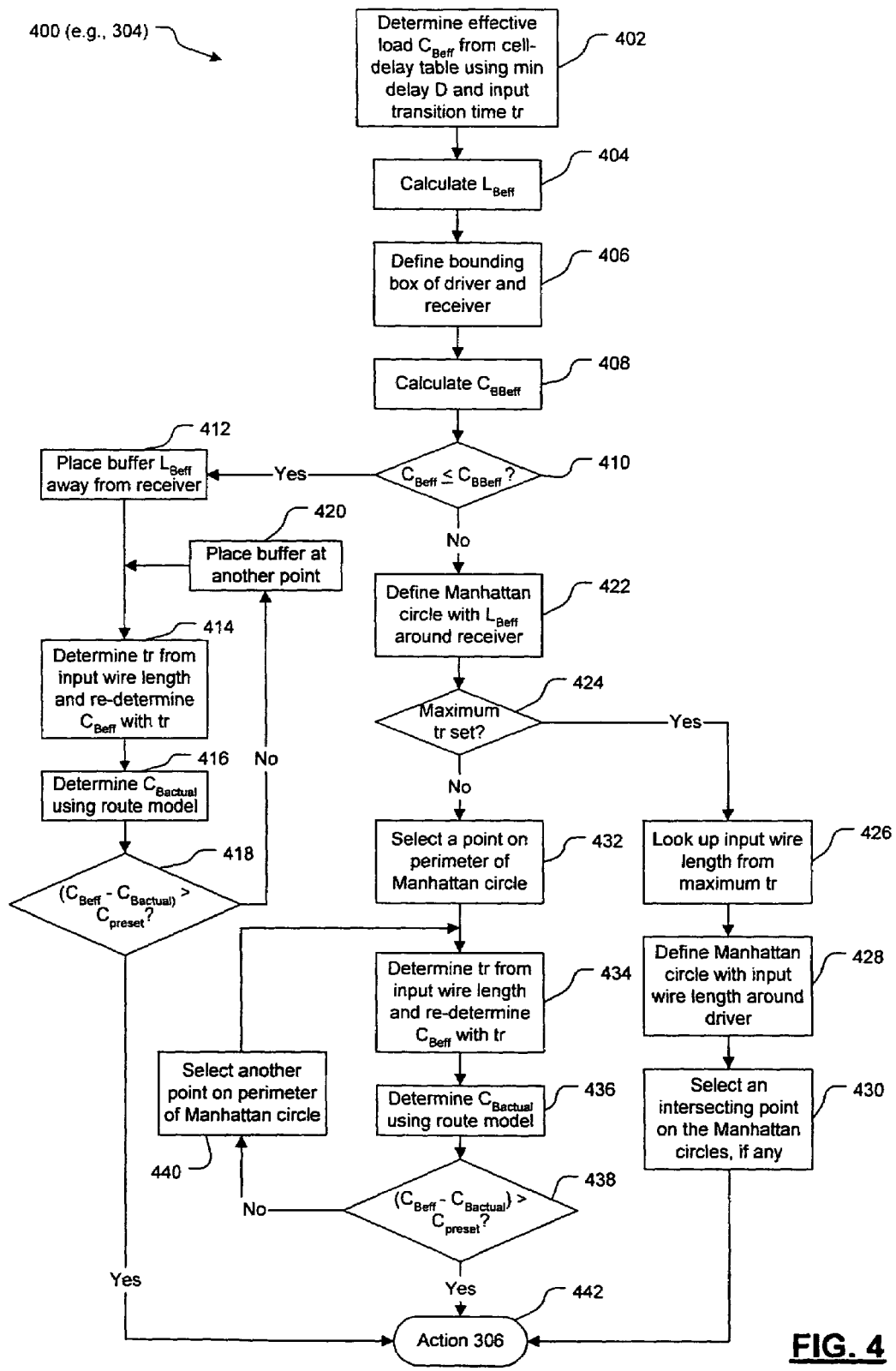
FIG. 4 shows a flowchart of a method for positioning a buffer at a node in the method of FIG. 3 in one embodiment.
Figure 10:
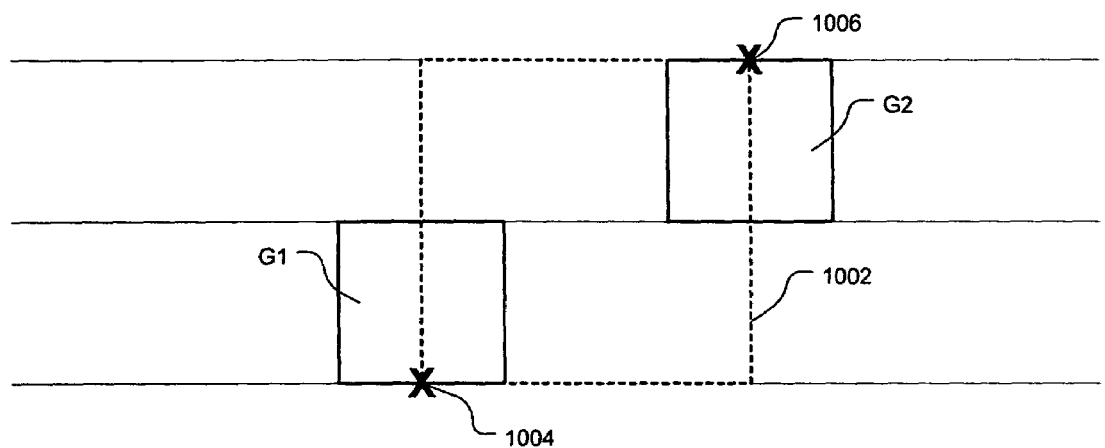
FIG. 10 shows a bounding box encompassing a driver and a receiver in one embodiment.

FIG. 4 shows one embodiment of method 400 for positioning the selected buffer between the associated driver and receiver of the selected node. In the continuing example, computer 1528 positions selected buffer 1106 (FIGS. 11 to 13) between associated driver cell G1 and receiver cell G2 of selected node 906. FIG. 10 schematically illustrates driver cell G1 and receiver cell G2 placed on different rows in an exemplary layout of integrated circuit 900 before buffer 1106 is inserted.

In action 402 (FIG. 4), computer 1528 determines an effective capacitive load $C_{Beff}$ on the selected buffer that produces the required minimum delay D under the input transition time $tr_{in}$ to the selected buffer. The effective capacitive load $C_{Beff}$ is the load on the selected buffer from a wire between the output pin of the selected buffer and the input pin of the receiver. Computer 1528 uses the required minimum delay D and the input transition time $tr_{in}$ to lookup an effective capacitive load $C_{Btotal}$ from the 2-D nonlinear cell-delay table for the selected buffer in the standard cell library. Effective capacitive load $C_{Btotal}$ includes both the effective capacitive load $C_{Beff}$ and the input pin capacitance of the receiver. Thus, effective capacitive load $C_{Beff}$ is equal to the difference between effective capacitive load $C_{Btotal}$ and the input pin capacitance of the receiver. The required minimum delay D is the worst minimum path slack previously calculated in the full timing analysis in action 104 (FIG. 1).

Computer 1528 must estimate the input transition time $tr_{in}$ to the selected buffer because the actual input transition time $tr_{in}$ to the selected buffer depends on the final position of the selected buffer determined during optimization. The actual input transition time to the selected buffer depends on the final position of the selected buffer for the following reasons. The final position of the selected buffer determines the Manhattan distance between the output pin of the driver and the input pin of the selected buffer. In integrated circuits, Manhattan distance refers to the shortest rectilinear distance between two points (e.g., the path of a wire between two points that would be routed by a route and placement tool). The Manhattan distance between the output pin of the driver and the input pin of the selected buffer determines the effective capacitive load on the driver from a wire connecting the output pin of the driver and the input pin of the selected buffer. The effective capacitive load on the driver and the input transition time to the driver determine the output transition time $tr_{out}$ from the driver. The output transition time $tr_{out}$ from the driver is added to the estimated wire delay of the a wire connecting the driver and the selected buffer to estimate the input transition time $tr_{in}$ to the selected buffer. The wire delay of the wire connecting the driver and the selected buffer is calculated by a static timing analyzer tool such as ShowTime from Sequence Design, Inc.

In one embodiment of action 402, computer 1528 uses the location of a centroid of (1) the input pin capacitance of the receiver and (2) the output pin capacitance of the driver as an estimated location of the input pin of the selected buffer. In one embodiment, the output pin capacitance of the driver is multiplied by a weight W (e.g., between 0 and 2) that can be specified by the designer. Computer 1528 sets weight W to 1 by default. From the location of the centroid, computer 1528 determines the Manhattan distance between the output pin of the driver and the location of the centroid. From the Manhattan distance between the output pin of the driver and the centroid, computer 1528 calculates the effective capacitive load on the driver. From the effective capacitive load on the driver and the input transition time to the driver, computer 1528 determines the output transition time $tr_{out}$ from the driver. From the output transition time $tr_{out}$ and a wire delay of a wire having the Manhattan distance between the output pin of the driver and the location of the centroid, computer 1528 determines the input transition time $tr_{in}$ to the selected buffer using delay calculations. Of course, other methods of estimating the input transition time may be used in other embodiments.

In the continuing example, computer 1528 determines a centroid location of the input pin capacitance of receiver cell G2 and the output pin capacitance of driver cell G1. From the location of the centroid, computer 1528 determines the Manhattan distance between the output pin of driver cell G1 and the centroid location. From the Manhattan distance between the output pin of driver cell G1 and the centroid location, computer 1528 calculates the effective capacitive load on driver cell G1. From the effective capacitive load on driver cell G1 and the known input transition time to driver cell G1, computer 1528 determines an output transition $tr_{out}$ from driver cell G1. From the output transition time $tr_{out}$ of driver cell G1 and a wire delay of a wire having the Manhattan distance between the output pin of driver cell G1 and the centroid location, computer 1528 determines an estimated input transition time $tr_{in}$ to selected buffer 1106. From the estimated input transition time $tr_{in}$ and the required minimum delay D, computer 1528 lookups the effective capacitive load $C_{Beff}$ on selected buffer 1106 from a 2-D nonlinear cell delay table for buffer 1106 in cell library 1520 (FIG. 15).

Figure 16:
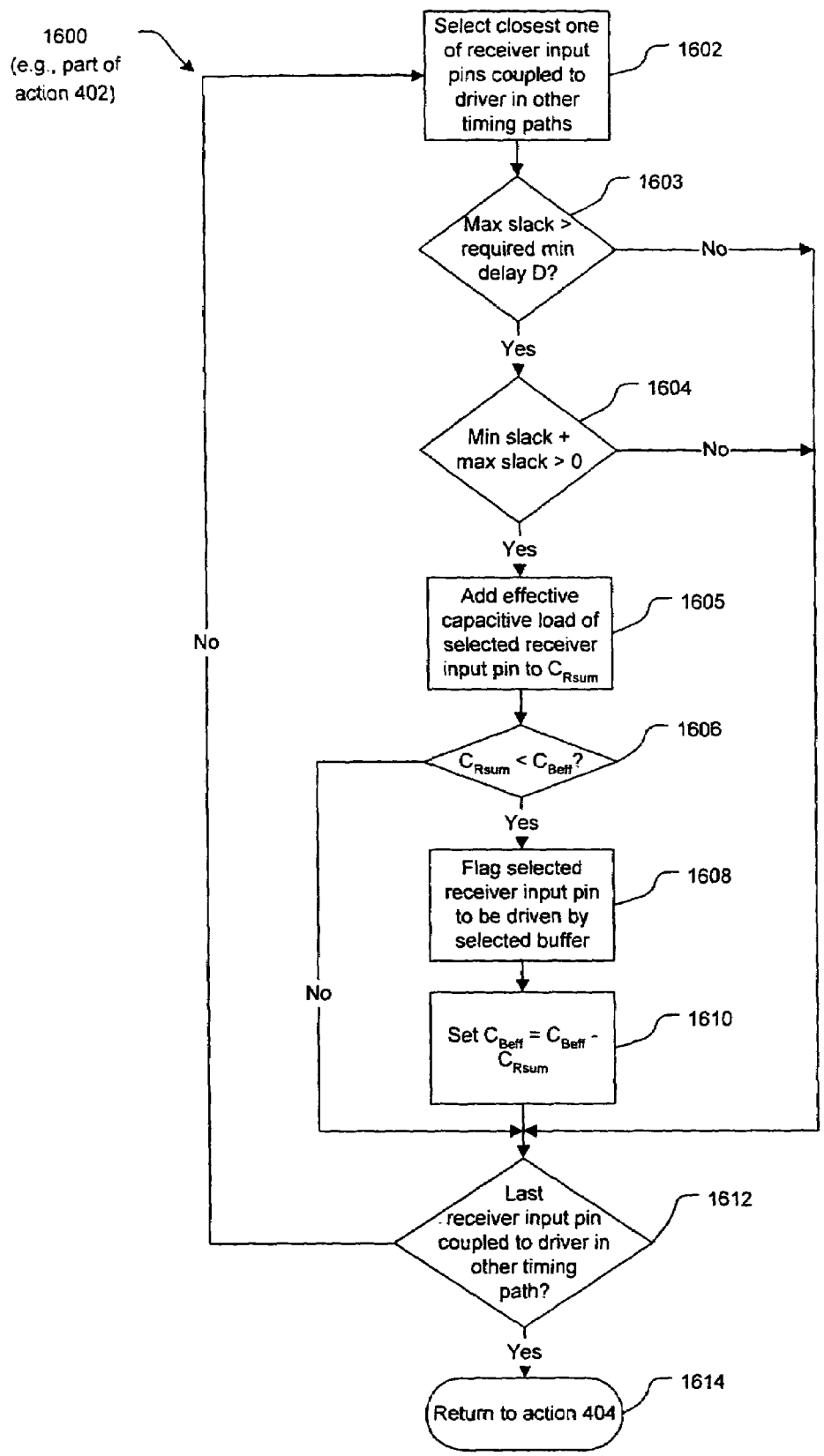
FIG. 16 illustrates an additional method 1600 to add addition loads onto a selected buffer to reduce the effective capacitive load necessary to generate a required minimum delay.

In one embodiment of action 402, computer 1528 performs an additional method 1600 as illustrated in FIG. 16 to add additional loads onto the selected buffer to reduce the effective capacitive load $C_{Beff}$ necessary to generate the required minimum delay D. In action 1602, computer 1528 selects the closest of the other receiver input pins connected to the driver in other timing paths. In the continuing example, there are two other receiver cells G21 and G22 (FIG. 9) connected to driver cell G1 in two other timing paths. Computer 1528 selects the input pin of receiver cell G21 because it is the closer of the input pins of the two receiver cells.

In action 1603, computer 1528 determines if the maximum path slack of the node at the selected input pin in the other timing path is greater than the required minimum delay D. This ensures that the added delay generated by the selected buffer does not create a max path violation on the node at the selected input pin. If the maximum path slack of the node at the selected input pin in the other timing path is greater than the required minimum delay D, then action 1603 is followed by action 1604. Otherwise, action 1603 is followed by action 1612 and method 1600 cycles until all the other receiver input pins coupled to the driver in other timing paths have been tried.

In action 1604, computer 1528 determines if the sum of the min path slack and the max path slack of the node at the selected input pin in the other timing path is greater than zero. This ensures that the timing constraints on the node at the selected input pin in the other timing path is feasible (i.e., there is a timing window where transition of a signal can occur). If the sum of the min path slack and the max path slack of the node at the input pin of the selected receiver is greater than zero, then action 1604 is followed by action 1605. Otherwise, action 1604 is followed by action 1612 and method 1600 cycles until all the other receiver input pins coupled to the driver in other timing paths have been tried.

In action 1605, computer 1528 adds the load of the selected input pin in the other timing path to a variable $C_{Rsum}$, which is initialized to 0. The load of the selected receiver is the wire capacitance from the output pin of the driver to the input pin of the selected receiver, and the input pin capacitance of the selected receiver. Variable $C_{Rsum}$ is the effective capacitive load from the other receiver input pins in other timing paths that can be added on the selected buffer.

In action 1606, computer 1528 determines if $C_{Rsum}$ is less than the effective capacitive load $C_{Beff}$. If so, computer 1528 can later use the selected buffer to drive both the associated receiver of the selected node and the selected input pin in the other timing path. The selected input pin from the other timing path will provide additional load on the selected buffer to create the required minimum delay D. If $C_{Rsum}$ is less than the effective capacitive load $C_{Beff}$, action 1606 is followed by action 1608. Otherwise action 1606 is followed by action 1612. In the continuing example, $C_{Rsum}$ from receiver cell G21 is assumed to be less than $C_{Beff}$.

In action 1608, computer 1528 flags the selected input pin in the other timing path so computer 1528 will later know to connect the selected buffer with both the associated receiver of the selected node and the selected input pin from the other timing path. In the continuing example, computer 1528 flags input pin of receiver G21 (FIG. 9) so selected buffer 1106 will later be connected to drive both input pins of associated receiver G2 and selected receiver G21.

In action 1610, computer 1528 sets a new value of the effective capacitance load $C_{Beff}$ equal to the its current value less $C_{Rsum}$. This is because part of the load needed for the selected buffer to generate the required minimum delay D is now generated by the selected input pin.

In action 1612, computer 1528 determines if the selected input pin is the last of the other receivers connected to the driver in other timing paths. If so, action 1612 is followed by action 1614 where computer 1528 ends method 1600 and continues to action 1404. If computer 1528 determines the selected input pin is not the last of the other input pins connected to the driver in other timing paths, action 1612 is followed by action 1602 and method 1600 cycles until computer 1528 has tried all the other input pins connected to the driver in other timing paths. In the continuing example, computer 1528 is assumed to have flagged the input pin of receiver cell G21 but not the input pin of receiver cell G22. Thus, selected buffer 1106 will drive receiver cells G2 and G21.

In action 404 (FIG. 4), computer 1528 determines a Manhattan distance $L_{Beff}$ of a wire that generates the effective capacitive load $C_{Beff}$ on the selected buffer. Computer 1528 converts the effective capacitive load $C_{Beff}$ on the selected buffer to the Manhattan distance $L_{Beff}$ using the correlation of the effective capacitive load as a function of the wire length in technology library 1518 (FIG. 15).

In action 406 (FIG. 4), computer 1528 defines a bounding box that encloses an output pin of the driver and an input pin of the receiver. In the continuing example, computer 1528 defines a bounding box 1002 (FIGS. 10 to 13) enclosing an output pin 1004 of driver cell G0 and an input pin 1006 of receiver cell G1.

In action 408 (FIG. 4), computer 1528 determines an effective capacitive load $C_{BBeff}$ of a wire having a Manhattan distance between the output pin of the driver and the input pin of the receiver within the bounding box (e.g., bounding box 1002 in FIG. 10). Effective capacitive load $C_{BBeff}$ is the largest load the selected buffer would drive if the selected buffer is placed within the bounding box. Thus, effective capacitive load $C_{BBeff}$ also causes the selected buffer to generate the longest delay if the selected buffer is placed within the bounding box. If effective capacitive load $C_{BBeff}$ is larger or equal to effective capacitive load $C_{Beff}$, then the selected buffer can be placed somewhere within the bounding box to generate the required minimum delay D.

Any Manhattan distance between the output pin of the driver and the input pin of the receiver within the bounding box is equal to half of the perimeter of the bounding box. Computer 1528 thus uses half of the perimeter of the bounding box as the Manhattan distance to determine effective capacitive loading $C_{BBeff}$. Computer 1528 uses the correlation of the effective capacitive load as a function of the wire length in technology library 1518 (FIG. 15) to calculate the effective capacitive load $C_{BBeff}$ for the Manhattan distance between pins of the driver and the receiver.

In the continuing example, computer 1528 determines the Manhattan distance between output pin 1004 of driver cell G1 and input pin 1006 of receiver cell G2 (i.e., half of perimeter of bounding box 1002). From the Manhattan distance, computer 1528 calculates the effective capacitive load $C_{BBeff}$ from the correlation of effective capacitive load as a function of the wire length in technology library 1518 (FIG. 15).

In action 410 (FIG. 4), computer 1528 determines if effective capacitive load $C_{Beff}$ is less than or equal to effective capacitive load $C_{BBeff}$. If so, then action 410 is followed by action 412 and subsequently the selected buffer is placed within the bounding box to generate the required minimum delay D. If effective capacitive load $C_{Beff}$ is not less than or equal to effective capacitive load $C_{BBeff}$, then action 410 is followed by action 422 and subsequently the selected buffer is placed outside the bounding box to generate the required minimum delay D. Computer 1528 compares effective capacitive loads instead of lengths of wires in action 410 because the effective capacitive load is a nonlinear function of the wire length so comparing wire lengths is not as accurate comparing effective capacitive loads in determining whether parasitic loading will cause the selected buffer to generate the required minimum delay D.

Figure 11:
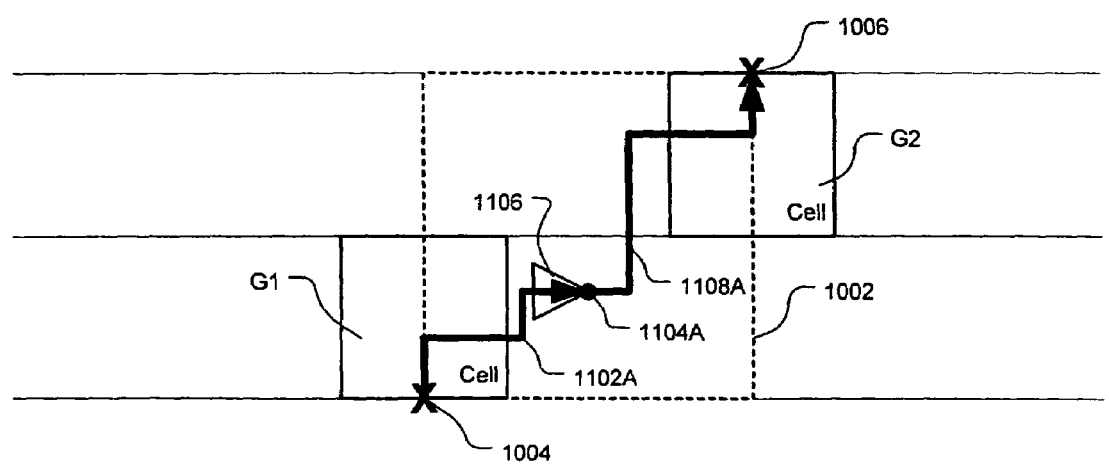
FIG. 11 shows the placement of a buffer within the bounding box of FIG. 10 in one embodiment.

In the continuing example, FIG. 11 is used to explain actions 412 to 420. In action 412, computer 1528 places selected buffer 1106 at a location 1104A a Manhattan distance $L_{Beff}$ from receiver cell G2 inside bounding box 1002. Computer 1528 places selected buffer 1106 at the first location it can find that is distance $L_{Beff}$ from the receiver. This location must not obstruct other elements of integrated circuit 900 (i.e., it must be a legal placement). Inside bounding box 1002, wire 1102A couples output pin 1004 of driver cell G1 to buffer 1106, and wire 1108A couples buffer 1106 to input pin 1006 of receiver cell G2.

In action 414 (FIG. 4), computer 1528 re-determines (1) the input transition time $tr_{in}$ to selected buffer 1106 from the Manhattan distance between driver cell G1 and selected buffer 1106, and (2) the effective capacitive load $C_{Beff}$ on buffer 1106 using the re-determined input transition time $tr_{in}$ and the required minimum delay D. From location 1104A of selected buffer 1106 set in action 412, computer 1528 calculates the Manhattan distance between output pin 1004 of driver cell G1 and selected buffer 1106. From the Manhattan distance between output pin 1004 of driver cell G1 and selected buffer 1106, computer 1528 re-calculates the effective capacitive load on driver cell G1. From the effective capacitive load on driver cell G1, and the input transition time to driver cell G1, computer 1528 re-determines the output transition time $tr_{out}$ of driver cell G1. From the output transition time $tr_{out}$ of driver cell G1 and the Manhattan distance between output pin 1004 and selected buffer 1106, computer 1528 re-determines the input transition time $tr_{in}$ to selected buffer 1106. From the re-determined input transition time $tr_{in}$ to selected buffer 1106 and the required minimum delay D of selected buffer 1106, computer 1528 re-determines the effective capacitive load $C_{Beff}$.

In action 416 (FIG. 4), computer 1528 determines an actual effective capacitive load $C_{Bactual}$ including the load (wire and pin capacitance) attributed to other elements such as receiver cells G21 (FIG. 9) that also receive an output signal from selected buffer 1106. In one embodiment of action 416, computer 1528 uses a route model to estimate the actual wire routes between logic cells G1, G2, and G21, and the actual effective capacitive load $C_{Bactual}$. Instead of performing actual routing, the route model approximates the routing to determine the parasitic loading. The route model is, e.g., provided by PhysicalStudio from Sequence Design, Inc. Of course, computer 1528 may use a place and route tool to route the wires between the elements and determine the actual effective capacitive load $C_{Bactual}$ in other embodiments.

In action 418 (FIG. 4), computer 1528 determines if effective capacitive load $C_{Beff}$ is greater than effective capacitive load $C_{Bactual}$ by a preset capacitance $C_{preset}$. Selected buffer 1106 will generate the required minimum delay when effective capacitive load $C_{Beff}$ is greater than effective capacitive load $C_{Bactual}$ by the capacitance $C_{preset}$. The value of preset capacitance $C_{preset}$ is specified by the designer. By default, computer 1528 sets the preset capacitance $C_{preset}$ to the capacitance of a few microns of the wire connecting selected buffer 1106 and receiver cell G2 (e.g., 10 femtofarad)

If effective capacitive load $C_{Beff}$ is greater than effective capacitive load $C_{Bactual}$ by the preset capacitance $C_{preset}$, action 418 is followed by action 442 where computer 1528 ends method 400 and returns to action 306 (FIG. 3) of method 300. Otherwise action 418 is followed by action 420 where computer 1528 moves the location of buffer 1106 a little further from receiver 1106 in bounding box 1002.

In action 420 (FIG. 4), computer 1528 moves the location of selected buffer 1106 (i.e., selects another location between driver cell G1 and receiver cell G2). Computer 1528 moves the location of selected buffer 1106 to increase or decrease input transition time $tr_{in}$ and the effective capacitive load $C_{Bactual}$ of selected buffer 1106. By increasing transition time $tr_{in}$ and $C_{Bactual}$ of selected buffer 1106, the delay generated by selected buffer 1106 is increased. Conversely, by decreasing transition time $tr_{out}$ and $C_{Bactual}$ of selected buffer 1106, the delay generated by selected buffer 1106 is decreased. To increase input transition time $tr_{in}$ and $C_{Bactual}$ of selected buffer 1106, computer 1528 moves selected buffer 1106 away from driver cell G1. To decrease input transition time $tr_{in}$ and $C_{Bactual}$ of selected buffer 1106, computer 1528 moves selected buffer 1106 toward driver cell G0.

In one embodiment of action 420, computer 1528 performs a binary search to place selected buffer so the effective capacitive load $C_{Beff}$ is greater than the effective capacitive load $C_{Bactual}$ by the preset capacitance $C_{preset}$. If $C_{Beff}$ is greater than the effective capacitive load $C_{Bactual}$ by less than the preset capacitance $C_{preset}$, computer 1528 performs a binary search of the Manhattan distances between location 1104A and input pin 1006 of receiver cell G2 to move selected buffer 1106 away from driver cell G1 to decrease $C_{Bactual}$. Conversely, if $C_{Beff}$ is less than the effective capacitive load $C_{Bactual}$, computer 1528 performs a binary search of Manhattan distances between location 1104A and output pin 1004 of driver cell G1 to move selected buffer 1106 toward driver cell G1.

In action 422 (FIG. 4) that follows a "no" path from action 410, computer 1528 defines a Manhattan circle with a radius of $L_{Beff}$ around the input pin of the receiver. A Manhattan circle is a diamond where each point on the perimeter has the same radius in Manhattan distance to the center of the Manhattan circle. In the continuing example, computer 1528 defines a Manhattan circle 1202 (FIG. 12) around output pin 1006 of receiver cell G2. Manhattan circle 1202 defines a perimeter where selected buffer 1106 may be placed to generate the required minimum delay D.

In action 424 (FIG. 4), computer 1528 determines if there is a maximum constraint on input transition time $tr_{in}$. A maximum constraint on input transition time $tr_{in}$ limits the Manhattan distance between the output pin of the driver and the selected buffer. There is a maximum constraint on input transition time $tr_{in}$ if the designer or the min path optimization tool sets an upper bound on the input transition time $tr_{in}$. The min path optimization tool can set the upper bound on the input transition time $tr_{in}$ by clipping any values that exceed those that can be looked up in the 2-D nonlinear output transition time table for the selected buffer and/or keep the input transition time $tr_{in}$ within a certain percentage of the average input transition times in the timing path. Such a constraint could be global or pin specific. If there is a maximum constraint on input transition time $tr_{in}$, action 424 is followed by action 426. If there is not a maximum constraint on input transition time $tr_{in}$, then action 424 is followed by action 432.

Figure 12:
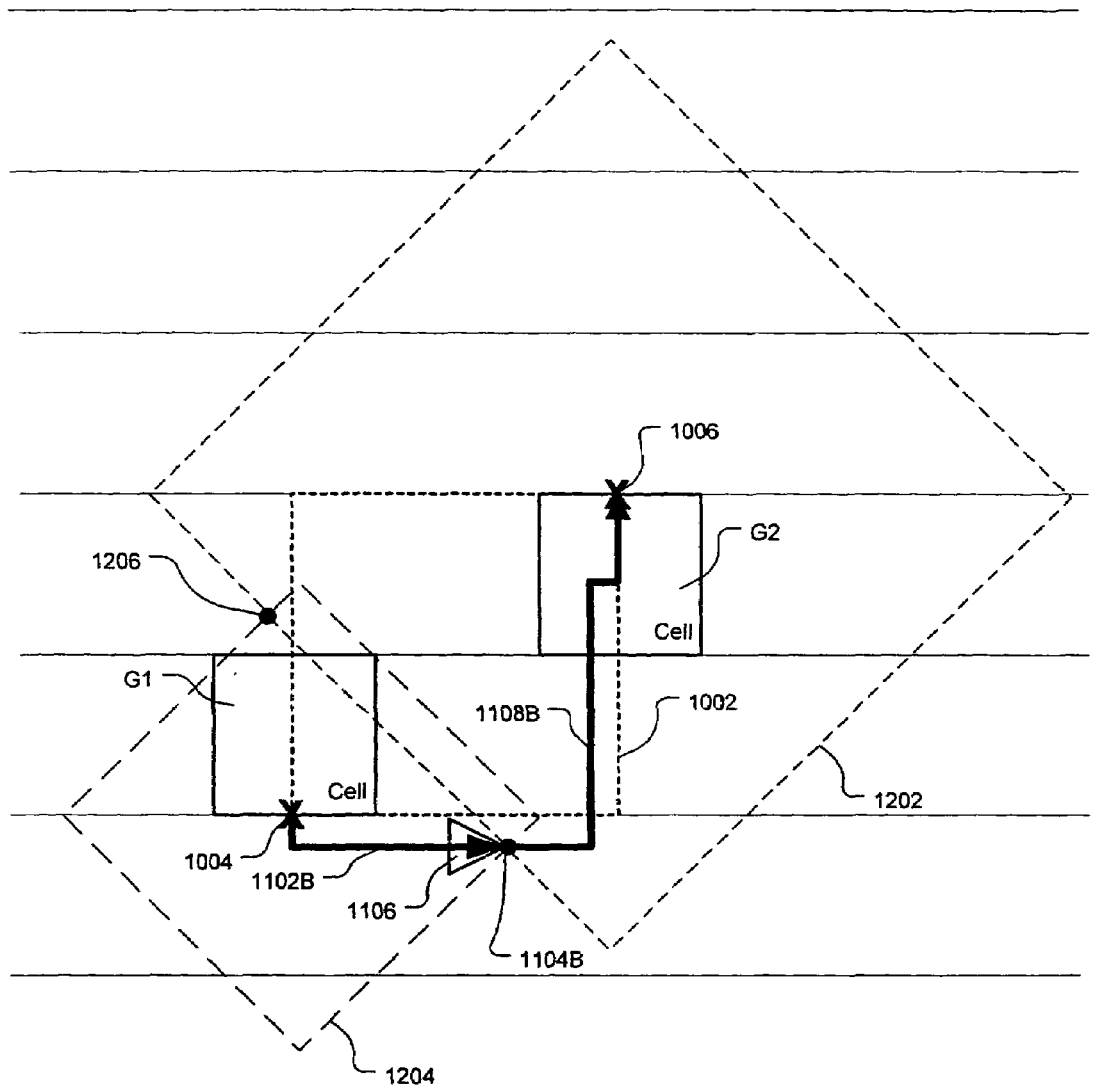
FIGS. 12 and 13 show the placement of a buffer outside the bounding box of FIG. 10 in various embodiments.

In the continuing example, FIG. 12 is used to explain actions 426, 428, and 430. In action 426 (FIG. 4), computer 1528 determines a Manhattan distance $L_{tr}$ of a wire 1102B that creates an effective capacitive load on driver cell G1 so driver cell G1 causes the maximum input transition time $tr_{in}$ to selected buffer 1106 that is allowed by the input transition time constraint. Computer 1528 determines length $L_{tr}$ in the following manner. From the maximum input transition time $tr_{in}$ to selected buffer 1106, computer 1528 calculates the output transition time $tr_{out}$ from driver cell G1 using delay calculation. From the output transition time $tr_{out}$ from driver cell G1 and the input transition time to driver cell G1, computer 1528 determines the effective capacitive load on driver cell G1 from the 2-D nonlinear output transition time table for driver cell G1 in standard cell library 1516 (FIG. 15). From the effective capacitive load of wire 1102B on driver cell G1, computer 1528 calculates the Manhattan distance of wire 1102B using the correlation of the effective capacitive load as a function of the wire length in technology library 1518 (FIG. 15).

In action 428 (FIG. 4), computer 1528 defines a Manhattan circle 1204 (FIG. 12) with a radius of Manhattan distance $L_{tr}$ around output pin 1004 of driver cell G1. Any point on the perimeter of Manhattan circle 1204 results in a wire 1102B with Manhattan distance $L_{tr}$ that satisfies the maximum constraint on the input transition time to selected buffer 1106.

In action 430 (FIG. 4), computer 1528 places selected buffer 1106 at an intersecting point 1104B between Manhattan circles 1202 and 1204. The placement of selected buffer 1106 at any interesting point (e.g., points 1104B and 1206) between Manhattan circles 1202 and 1204 will result in a selected buffer 1106 receiving the maximum allowed input transition time $tr_{in}$ and generating the required minimum delay D. If there is no intersection, then there is no solution and computer 1528 proceeds to optimize the next node. Action 430 is followed by action 442 where computer 1528 ends method 400 and returns to action 306 (FIG. 3) of method 300.

Figure 13:
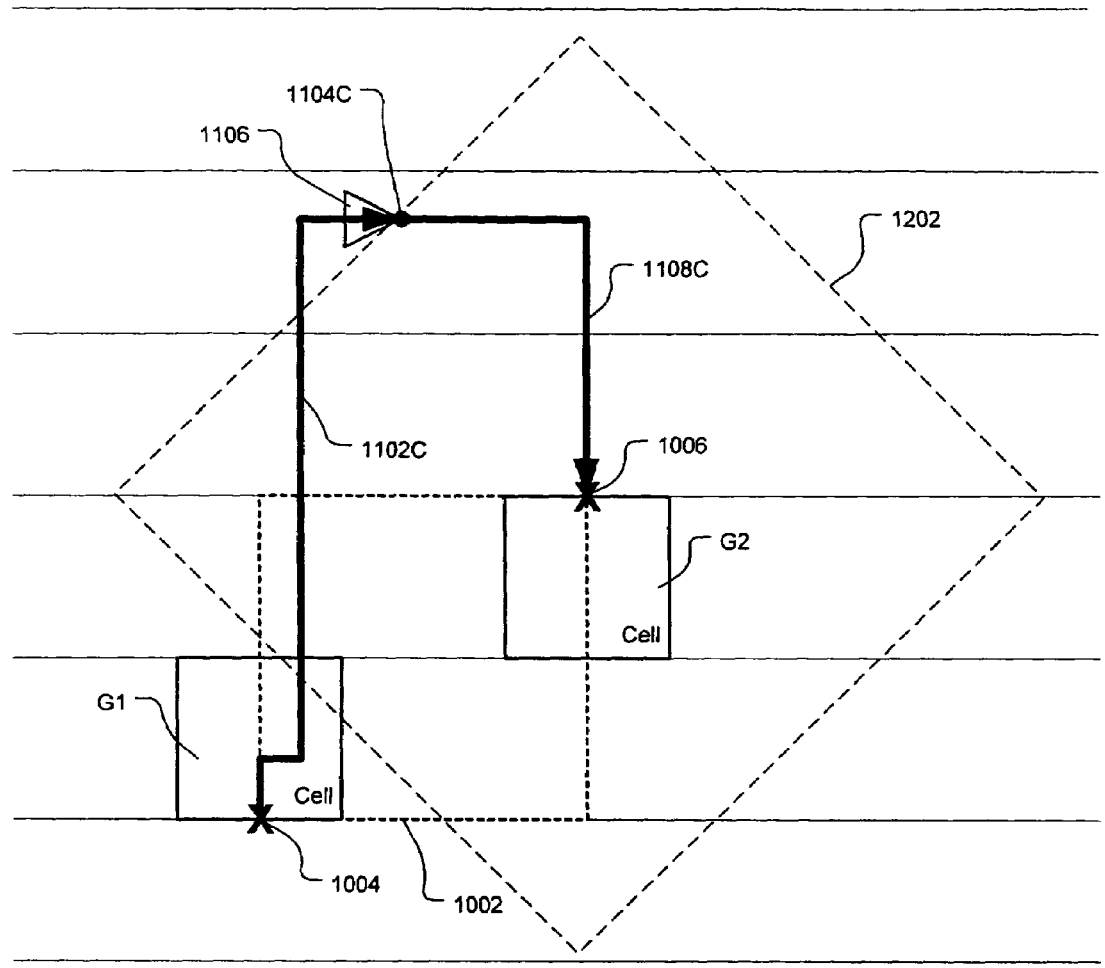

In the continuing example, FIG. 13 is used to explain actions 432 to 440. In action 432 (FIG. 4) that follows the "no" path from action 424, computer 1528 selects a point 1104C on the perimeter of Manhattan circle 1202. Computer 1528 does not select any point on the perimeter of the Manhattan circle 1202 that falls within bounding box 1002 because those points do not provide the adequate effective capacitive loading $C_{Beff}$ to cause selected buffer 1106 to generate the required minimum delay D.

In action 434 (FIG. 4), computer 1528 re-determines (1) the estimated input transition time $tr_{in}$ to selected buffer 1106 from the Manhattan distance between driver cell G1 and selected buffer 1106, and (2) the effective capacitive load $C_{Beff}$ using the re-determined input transition time $tr_{in}$ and the required minimum delay D. Action 434 is the same as action 414.

In action 436 (FIG. 4), computer 1528 determines the actual effective capacitive load $C_{Bactual}$ on selected buffer 1106. Action 436 is the same as action 416.

In action 438 (FIG. 4), computer 1528 determines if the effective capacitive load $C_{Beff}$ is greater than the effective load $C_{Bactual}$ by the preset capacitance $C_{preset}$. If so, action 438 is followed by action 442 where computer 1528 ends method 400 and returns to action 306 (FIG. 3) of method 300. Otherwise action 438 is followed by action 440. Action 438 is the same as action 418.

In action 440 (FIG. 4), computer 1528 selects another point on the perimeter of Manhattan circle 1202. In one embodiment of action 440, computer 1528 selects the next point on Manhattan circle 1202 using a binary search along the edges of Manhattan circle 1202. For example, computer 1528 first searches the midpoints of the four edges of Manhattan circle 1202. These midpoints divide the four edges into eight segments. If the effective load $C_{Bactual}$ is again not less than the effective capacitive load $C_{Beff}$ within the preset capacitance $C_{preset}$, computer 1528 then searches the midpoints of the eight segments. This process repeats until computer 1528 finds a point where load $C_{Bactual}$ is less than the effective capacitive load $C_{Beff}$ within the preset capacitance $C_{preset}$, or until all points on the perimeter of Manhattan circle 1202 is exhausted. As previously described with respect to action 432, computer 1528 does not select any point on the perimeter of Manhattan circle 1202 that falls within bounding box 1002 because those points do not provide the adequate loading $C_{Beff}$ to cause buffer 1106 to generate desired delay D.

FIG. 5 shows one embodiment of action 308 (FIG. 3) for selecting a buffer from all the buffers that generate the required minimum delay D. In action 502 (FIG. 5), computer 1528 determines if the number of improved timing arcs (determined in the trail analysis in action 306) is greater than or equal to the best number of improved timing arcs. The best number of improved timing arcs is initialized to a predetermined number (e.g., 0). If the number of improved timing arcs is greater than or equal to the best number of improved timing arcs, action 502 is followed by action 504. Otherwise, action 502 is followed by action 510 where computer 1528 rejects the selected buffer.

In action 504 (FIG. 5), computer 1528 determines if the number of improved arcs is greater than the best number of improved arcs. If so, then action 504 is followed by action 512. If the number of improved arcs is not greater than the best number of improved arcs, then action 504 is followed by action 506.

In action 506 (FIG. 5), computer 1528 determines if the number of worsened arcs (determined in the trail analysis in action 306) is less than or equal to the best number of worsened arcs. The best number of worsened arcs is initialized to a predetermined number (e.g., 0). If the number of worsened arcs is less than or equal to the best number of worsened arcs, then action 506 is followed by action 512. Otherwise, action 506 is followed by action 508.

In action 508 (FIG. 5), computer 1528 performs a gain analysis to estimate the benefits and costs of using the selected buffer. In one embodiment of action 508, computer 1528 uses the following formula to determine the gain.

$$\text{Gain} = (\text{scale} * f\text{Plus} + f\text{Minus})/d\text{Area} \qquad (1.3)$$

In Formula 1.3, scale is an empirically determined scale factor, fPlus is the increase in delay of all the improved arcs, fMinus is the decrease in delay of all the worsened arcs, and dArea is the increase in the area of the overall integrated circuit 900 (i.e., the area of the selected buffer).

In action 510 (FIG. 5), computer 1528 rejects the selected buffer. In action 512, computer 1528 accepts the selected buffer and sets the best number of improved and worsened arcs and gain equal to the number of improved and worsened arcs and gain of the selected buffer. Both actions 510 and 512 are followed by action 514 where computer 1528 ends method 500 and returns to action 310 in method 300 (FIG. 3)

Although the invention has been described with reference to particular embodiments, the description is a representative example and should not be taken as limiting. Various other adaptions and combinations of features of the embodiments disclosed are within the scope of the invention. Therefore, the invention is limited only by the following claims.

I claim:

1. A method for selecting nodes in a electronic circuit to be optimized, comprising:
    examining each node according to a minimum path slack and a maximum path slack associated with the node; and
    putting nodes into a plurality of criticality bins according to the minimum path slacks and maximum path slacks associated with the nodes, wherein each criticality bin is defined by a range of minimum path slacks or a range of maximum path slacks.

2. The method of claim 1, wherein said plurality of criticality bins comprises:
    a first criticality bin for nodes with critical minimum path slacks and non-critical maximum path slacks;
    a second criticality bin for nodes with sub-critical minimum path slacks and non-critical maximum path slacks;
    a third criticality bin for nodes with critical minimum path slacks and sub-critical maximum path slacks;
    a fourth criticality bin for nodes with sub-critical minimum paths slacks and sub-critical maximum path slacks;
    a fifth criticality bin for nodes with critical minimum path slacks and critical maximum path slacks; and
    a sixth criticality bin for nodes with sub-critical minimum path slacks and critical maximum path slacks.

3. The method of claim 2, wherein:
    said critical minimum path slacks include minimum path slacks less than a first minimum slack;
    said sub-critical minimum path slacks include minimum path slacks greater than said first minimum slack and less than a second minimum slack;
    said non-critical minimum path slacks include minimum path slacks greater than said second minimum slack;

said critical maximum path slacks include maximum path slacks less than a first maximum slack;
said sub-critical maximum path slacks include maximum path slacks greater than said first maximum slack and less than a second maximum slack; and
said non-critical maximum path slacks include maximum slacks greater than said second maximum slack.

4. The method of claim 3, wherein:
the first minimum slack is 0;
the second minimum slack is 100 picoseconds;
the first maximum slack is 0; and
the second maximum slack is 100 picoseconds.

5. The method of claim 1, further comprising:
selecting a criticality bin from said plurality of criticality bins; and
putting nodes in said selected criticality bin into a number of a plurality of slack bins divided between a first minimum path slack and a second minimum path slack.

6. The method of claim 5, wherein the first minimum path slack is the most negative minimum path slack of the nodes in said criticality bin and the second minimum path slack is 0.

7. The method of claim 5, further comprising:
putting nodes into a plurality of level bins, wherein each level bin is defined by a range of node levels in timing paths;
selecting a slack bin from said plurality of slack bins; and
putting nodes in said selected slack bin into said plurality of level bins according to their associated node levels in timing paths.

8. The method of claim 7, further comprising:
selecting a node; and
optimizing said node to remove a timing violation.

9. The method of claim 8, wherein said optimizing said node comprises:
determining a required delay between a driver and a receiver;
selecting a buffer to be inserted between said driver and said receiver;
determining an input transition time to said buffer from said driver;
determining a desired effective load on said buffer that causes said buffer to generate said required delay under said input transition time;
determining a desired effective length of a wire that generates said desired effective load;
determining a length of a conductor between said driver and said receiver inside a bounding box that encloses said driver and said receiver;
determining a maximum effective load generated by said length of a conductor, if said desired effective load is less than or equal to said maximum effective load, inserting said buffer at a point inside said bounding box; and
if said desired effective load is greater than said maximum effective load, inserting said buffer at a point outside said bounding box.

10. The method of claim 8, further comprising:
performing an incremental analysis to re-determine minimum and maximum path slacks of nodes affected by said optimization; and
again putting said nodes in said plurality of level bins according to their node levels in timing paths.

11. The method of claim 10, further comprising:
reducing said number of a plurality of slack bins by one;
again putting said nodes into said plurality of slack bins.

12. The method of claim 11, further comprising again putting said nodes in said plurality of criticality bins.

* * * * *